United States Patent
Yamada

(10) Patent No.: US 7,704,825 B2
(45) Date of Patent: Apr. 27, 2010

(54) METHOD OF FABRICATING MEMORY INCLUDING DIODE

(75) Inventor: Kouichi Yamada, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 12/149,137

(22) Filed: Apr. 28, 2008

(65) Prior Publication Data

US 2008/0206946 A1 Aug. 28, 2008

Related U.S. Application Data

(62) Division of application No. 11/073,897, filed on Mar. 8, 2005, now Pat. No. 7,476,945.

(30) Foreign Application Priority Data

Mar. 17, 2004 (JP) ............................. 2004-075768
Jun. 9, 2004 (JP) ............................. 2004-170749

(51) Int. Cl.
*H01L 21/8239* (2006.01)
*H01L 21/8246* (2006.01)
*H01L 21/8234* (2006.01)
*H01L 27/10* (2006.01)
*H01L 27/112* (2006.01)
*H01L 27/105* (2006.01)

(52) U.S. Cl. ....................... 438/237; 438/275; 438/279; 438/262; 438/258; 257/E21.619; 257/E21.62; 257/E21.665; 257/E21.673; 257/E21.435; 257/E21.634; 257/E21.662; 257/E27.07; 257/E27.102

(58) Field of Classification Search ................. 438/257, 438/258, 275, 279, 262, 237; 257/E27.07, 257/E27.102, E21.421, E21.435, E21.619, 257/E21.62, E21.634, E21.662, E21.665, 257/E21.673

See application file for complete search history.

(56) References Cited

U.S. PATENT DOCUMENTS

| | | | | |
|---|---|---|---|---|
| 5,130,769 A | * | 7/1992 | Kuo et al. | .................. 257/316 |
| 5,272,098 A | * | 12/1993 | Smayling et al. | ............ 438/268 |
| 5,340,762 A | | 8/1994 | Vora | |

(Continued)

FOREIGN PATENT DOCUMENTS

CN 1242606 A 1/2000

(Continued)

OTHER PUBLICATIONS

Chinese Office Action issued in Chinese Patent Application No. CN 200510055108.1, dated Mar. 7, 2008.

(Continued)

*Primary Examiner*—M. Wilczewski
(74) *Attorney, Agent, or Firm*—McDermott Will & Emery LLP

(57) ABSTRACT

A memory capable of reducing the memory cell size is provided. This memory includes a first conductive type first impurity region formed on a memory cell array region of the main surface of a semiconductor substrate for functioning as a first electrode of a diode included in a memory cell and a plurality of second conductive type second impurity regions, formed on the surface of the first impurity region at a prescribed interval, each functioning as a second electrode of the diode.

4 Claims, 15 Drawing Sheets

U.S. PATENT DOCUMENTS

| | | | |
|---|---|---|---|
| 5,675,533 A * | 10/1997 | Niuya et al. | 365/175 |
| 5,767,544 A | 6/1998 | Kuroda et al. | |
| 5,780,906 A * | 7/1998 | Wu et al. | 257/368 |
| 5,841,175 A | 11/1998 | Sugiura et al. | |
| 5,843,824 A | 12/1998 | Chou et al. | |
| 5,920,499 A | 7/1999 | Chang | |
| 6,018,168 A * | 1/2000 | Yang | 257/207 |
| 6,097,625 A | 8/2000 | Scheuerlein | |
| 6,215,157 B1 | 4/2001 | Fukuda | |
| 6,258,668 B1 | 7/2001 | Lee et al. | |
| 6,329,693 B1 | 12/2001 | Kumagai | |
| 6,522,587 B1 | 2/2003 | Furuhata et al. | |
| 6,624,026 B1 | 9/2003 | Liu et al. | |
| 6,628,544 B2 | 9/2003 | Shum et al. | |
| 6,630,707 B1 | 10/2003 | Shinmori | |
| 6,710,397 B1 | 3/2004 | Hsu et al. | |
| 6,784,501 B2 | 8/2004 | Lane et al. | |
| 6,803,284 B2 | 10/2004 | Hwang | |
| 6,819,592 B2 | 11/2004 | Noguchi et al. | |
| 6,858,890 B2 | 2/2005 | Jacob et al. | |
| 6,888,190 B2 | 5/2005 | Yang et al. | |
| 6,927,430 B2 | 8/2005 | Hsu | |
| 6,927,450 B2 | 8/2005 | Nishizaka et al. | |
| 7,084,437 B2 * | 8/2006 | Kitamura et al. | 257/104 |
| 7,094,649 B2 | 8/2006 | Lee et al. | |
| 7,208,751 B2 | 4/2007 | Ooishi | |
| 7,224,205 B2 * | 5/2007 | Kapoor | 327/534 |
| 7,233,526 B2 * | 6/2007 | Umezawa | 365/185.27 |
| 7,242,608 B2 | 7/2007 | Ohsawa | |
| 7,245,533 B2 * | 7/2007 | Shibata | 365/185.17 |
| 7,256,112 B2 * | 8/2007 | Chong et al. | 438/593 |
| 7,348,640 B2 * | 3/2008 | Yamada | 257/390 |
| 7,425,742 B2 * | 9/2008 | Nazarian | 257/316 |
| 7,468,919 B2 * | 12/2008 | Sekar et al. | 365/185.27 |
| 7,476,945 B2 * | 1/2009 | Yamada | 257/401 |
| 7,518,900 B2 * | 4/2009 | Yamada | 365/103 |
| 2002/0060331 A1 | 5/2002 | Shimizu et al. | |
| 2002/0063267 A1 | 5/2002 | Kumagai et al. | |
| 2002/0123190 A1 | 9/2002 | Nakamura et al. | |
| 2002/0127793 A1 | 9/2002 | Murata et al. | |
| 2004/0051094 A1 | 3/2004 | Ooishi | |
| 2004/0238880 A1 | 12/2004 | Nagasaka et al. | |
| 2005/0111247 A1 | 5/2005 | Takaura et al. | |
| 2005/0190608 A1 | 9/2005 | Matsuzaki et al. | |
| 2005/0269646 A1 * | 12/2005 | Yamada | 257/390 |
| 2007/0019459 A1 * | 1/2007 | Yamada | 365/103 |
| 2008/0029826 A1 * | 2/2008 | Suzuki et al. | 257/390 |
| 2008/0144354 A1 * | 6/2008 | Choi et al. | 365/148 |
| 2008/0258129 A1 * | 10/2008 | Toda | 257/5 |
| 2009/0034316 A1 * | 2/2009 | Yamada | 365/104 |

FOREIGN PATENT DOCUMENTS

| | | |
|---|---|---|
| JP | 05-275656 | 10/1993 |
| JP | 6-29493 | 2/1994 |
| JP | 11-026607 | 1/1999 |
| JP | 2000-331473 | 11/2000 |
| JP | 2002-141481 | 5/2002 |

OTHER PUBLICATIONS

Chinese Office Action, with English translation, issued in Chinese Patent Application No. CN 200510055108.1, mailed Aug. 8, 2008.

* cited by examiner

METHOD OF FABRICATING MEMORY INCLUDING DIODE

RELATED APPLICATIONS

This application is a Divisional of U.S. application Ser. No. 11/073,897, filed Mar. 8, 2005, now U.S. Pat. No. 7,476,945 claiming priority of Japanese Application Nos. 2004-075768, filed Mar. 17, 2004, and 2004-170749, filed Jun. 9, 2004, the entire contents of each of which are hereby incorporated by reference.

BACKGROUND OF THE INVENTION

1. Field of the Invention

The present invention relates to a memory and a method of fabricating the same, and more particularly, it relates to a memory such as a mask ROM and a method of fabricating the same.

2. Description of the Background Art

In general, a mask ROM is known as an exemplary memory, as disclosed in Japanese Patent Laying-Open No. 5-275656 (1993), for example.

FIG. 32 is a plane layout diagram showing the structure of a conventional contact-type mask ROM. FIG. 33 is a sectional view of the conventional contact-type mask ROM taken along the line 500-500 in FIG. 32. Referring to FIGS. 32 and 33, a plurality of impurity regions 102 containing an impurity diffused therein are formed on the upper surface of a substrate 101 at prescribed intervals in the conventional contact-type mask ROM. A word line 104 functioning as a gate electrode is formed on an upper surface portion of the substrate 101 corresponding to a clearance between each adjacent pair of impurity regions 102 through a gate insulating film 103. This word line 104, the gate insulating film 103 and the corresponding pair of impurity regions 102 form each transistor 105. A first interlayer dielectric film 106 is formed to cover the upper surface of the substrate 101 and the word lines 104. The first interlayer dielectric film 106 has contact holes 107 formed in correspondence to the respective impurity regions 102, and first plugs 108 are embedded in the contact holes 107 to be connected to the impurity regions 102 respectively.

Source lines (GND lines) 109 and connection layers 110 are provided on the first interlayer dielectric film 106, to be connected to the first plugs 108. Each transistor 105 is provided every memory cell 111. A second interlayer dielectric film 112 is formed on the first interlayer dielectric film 106 to cover the source lines (GND lines) 109 and the connection layers 110. Contact holes 113 are formed in regions of the second interlayer dielectric film 112 located on prescribed ones of the connection layers 110, while second plugs 114 are embedded in the contact holes 113. Bit lines 115 are formed on the second interlayer dielectric film 112, to be connected to the second plugs 114. Thus, the bit lines 115 are connected with the impurity regions 102 of the transistors 105.

In the conventional contact-type mask ROM, those of the transistors 105 provided with the second plugs 114 are connected (contacted) to the corresponding bit lines 115. Each memory cell 111 stores data "0" or "1" in response to whether or not the transistor 105 included therein is connected to the corresponding bit line 115.

In the conventional mask ROM shown in FIG. 32, however, the memory cell size is disadvantageously increased due to the transistors 105 provided in correspondence to the respective memory cells 111.

SUMMARY OF THE INVENTION

The present invention has been proposed in order to solve the aforementioned problem, and an object thereof is to provide a memory capable of reducing the memory cell size.

In order to attain the aforementioned object, a memory according to a first aspect of the present invention comprises a first conductive type first impurity region formed on a memory cell array region of the main surface of a semiconductor substrate for functioning as a first electrode of a diode included in a memory cell and a plurality of second conductive type second impurity regions, formed on the surface of the first impurity region at a prescribed interval, each functioning as a second electrode of the diode.

As hereinabove described, the memory according to the first aspect is provided on the main surface of the semiconductor substrate with the first conductive type first impurity region functioning as the first electrode of the diode included in the memory cell and the second conductive type second impurity regions each functioning as the second electrode of the diode included in the memory cell, whereby a crosspoint memory can be formed by arranging the diode consisting of the first and second impurity regions in the form of a matrix (crosspoint). In this case, each memory cell includes a single diode, whereby the memory cell size can be more reduced as compared with a case where each memory cell includes a single transistor. Further, the plurality of second impurity regions are so formed on the surface of the first impurity region that a plurality of diodes can be formed on the single first impurity region, whereby the first impurity region can be employed in common for the plurality of diodes. Thus, the structure of and the fabrication process for the memory cell array region can be simplified.

The aforementioned memory according to the first aspect preferably further comprises an interlayer dielectric film, formed on the first impurity region, including openings provided on regions corresponding to the second impurity regions and wires connected to the second impurity regions through the openings, while the openings are also employed for introducing a second conductive type impurity into the first impurity region when forming the second impurity regions. According to this structure, the openings employed for introducing the second conductive type impurity into the first impurity region for forming the second impurity regions can be employed as those for connecting the wires to the second impurity regions after introduction of the impurity. Thus, no additional openings may be formed for connecting the wires to the second impurity regions after formation of the second impurity regions, whereby a fabrication process for forming the wires connected to the second impurity regions can be simplified.

The aforementioned memory according to the first aspect preferably further comprises a selection transistor, provided for a plurality of memory cells, having a pair of source/drain regions, while the first impurity region preferably functions not only as the first electrode of the diode but also as one of the source/drain regions of the selection transistor. According to this structure, one of the source/drain regions of the selection transistor and the first electrode of the diode can be formed through a single step of forming the first impurity region, whereby the fabrication process can be simplified.

In the aforementioned structure including the selection transistor, the first impurity region is preferably divided on a region corresponding to the selection transistor. According to this structure, resistance of the first impurity region can be inhibited from increase resulting from an increased length of the first impurity region, whereby resistance loss of a current flowing through the first impurity region can be inhibited from increase.

In the aforementioned structure including the selection transistor, the other one of the source/drain regions of the selection transistor preferably includes at least a third impurity region, and the first impurity region preferably includes at least a fourth impurity region having an impurity concentration substantially identical to the impurity concentration of the third impurity region. According to this structure, the fourth impurity region of the first impurity region functioning as the first electrode of the diode can be formed through the same step as that for forming the third impurity region of the selection transistor, whereby the fabrication process for the diode constituting the memory cell can be simplified.

In this case, the first impurity region preferably further includes a fifth impurity region implanted deeper than the fourth impurity region, and the memory preferably further comprises a transistor, formed on a peripheral circuit region of the main surface of the semiconductor substrate, including a pair of source/drain regions having sixth impurity regions of an impurity concentration substantially identical to the impurity concentration of either the fourth impurity region or the fifth impurity region. According to this structure, the sixth impurity regions of the source/drain regions of the transistor formed on the peripheral circuit region can be formed through the same step as that for forming either the fourth or fifth impurity region when the first impurity region functioning as the first electrode of the diode is so constituted as to include the fourth and fifth impurity regions, whereby the fabrication process for the diode constituting the memory cell can be further simplified.

In the aforementioned structure including the selection transistor, the memory preferably further comprises a word line provided on the memory cell array region along the first impurity region, the selection transistor preferably includes a first selection transistor and a second selection transistor, and a first gate electrode of the first selection transistor and a second gate electrode of the second selection transistor are preferably provided integrally with the word line and arranged to obliquely intersect with the longitudinal direction of the first impurity region on regions formed with the first selection transistor and the second selection transistor. According to this structure, the interval between word lines adjacent to each other perpendicularly to the direction along the first impurity region can be further reduced as compared with a case of constituting the gate electrode by partially arranging the word line to be perpendicular to the direction along the first impurity region. Thus, the memory cell size can be further reduced. Further, the gate electrode of the selection transistor common to the plurality of memory cells can be constituted with the word line by providing the first and second gate electrodes of the first and second selection transistors corresponding to the plurality of memory cells integrally with the word line, whereby load capacity of the word line can be remarkably reduced as compared with a case of constituting a gate electrode of a selection transistor with the word line every memory cell. Thus, the word line can be driven at a high speed.

In the aforementioned structure having the selection transistor including the first and second selection transistors, the first impurity region is preferably divided on regions corresponding to the first selection transistor and the second selection transistor. According to this structure, resistance of the first impurity region can be inhibited from increase resulting from an increased length of the first impurity region. Thus, resistance loss of a current flowing through the first impurity region can be inhibited from increase.

In the aforementioned structure having the divided first impurity region, two word lines provided along divided portions of the first impurity region respectively are preferably connected with each other through the first gate electrode and the second gate electrode. According to this structure, the word lines can be singly linked with the divided portions of the first impurity region, whereby the number of word lines can be inhibited from increase dissimilarly to a case of providing word lines for the plurality of divided portions of the first impurity region respectively.

In the aforementioned structure having the selection transistor including the first and second selection transistors, the first selection transistor and the second selection transistor preferably share the other one of the source/drain regions. According to this structure, the memory cell size can be further reduced as compared with a case of individually providing the other one of the source/drain regions in each of the first and second selection transistors.

In the aforementioned memory according to the first aspect, the memory cell preferably further includes an element with resistance change provided on the diode. According to this structure, the memory cell size can be reduced while the structure of and the fabrication process for the memory cell array region can be simplified in the memory having the diode provided thereon with the element with resistance change.

In the aforementioned memory according to the first aspect, the memory cell including the diode is preferably arranged in the form of a matrix. According to this structure, a crosspoint memory can be easily obtained.

A method of fabricating a memory according to a second aspect of the present invention comprises steps of forming a first conductive type first impurity region functioning as a first electrode of a diode included in a memory cell by introducing a first conductive type impurity into a memory cell array region on the main surface of a semiconductor substrate and forming a plurality of second conductive type second impurity regions each functioning as a second electrode of the diode by introducing a second conductive type impurity into prescribed regions of the surface of the first impurity region.

In the method of fabricating a memory according to the second aspect, as hereinabove described, the first conductive type first impurity region functioning as the first electrode of the diode included in the memory cell is formed by introducing the first conductive type impurity into the main surface of the semiconductor substrate while the second conductive type second impurity regions each functioning as the second electrode of the diode are formed by introducing the second conductive type impurity into the surface of the first impurity region, whereby a crosspoint memory can be formed by arranging the diode consisting of the first and second impurity regions in the form of a matrix (crosspoint). In this case, each memory cell includes a single diode, whereby the memory cell size can be more reduced as compared with a case where each memory cell includes a single transistor. Further, the plurality of second impurity regions are so formed on the surface of the first impurity region that a plurality of diodes can be formed on the single first impurity region, whereby the first impurity region can be employed in common for the plurality of diodes. Thus, the structure of and the fabrication process for the memory cell array region can be simplified.

The aforementioned method of fabricating a memory according to the second aspect preferably further comprises steps of forming an interlayer dielectric film having openings on the first impurity region and forming wires connected to the second impurity regions through the openings, while the step of forming the second impurity regions preferably includes a step of ion-implanting the second conductive type impurity into the first impurity region through the openings. According to this structure, the openings employed for ion-implanting the second conductive type impurity into the first impurity region for forming the second impurity regions can be employed as those for connecting the wires to the second impurity regions after introduction of the impurity. Thus, no additional openings may be formed for connecting the wires to the second impurity regions after formation of the second impurity regions, whereby a fabrication process for forming the wires connected to the second impurity regions can be simplified.

In this case, the method of fabricating a memory preferably further comprises steps of forming a source/drain region of a transistor included in a peripheral circuit by introducing the second conductive type impurity into a peripheral circuit region on the main surface of the semiconductor substrate and forming a contact region for reducing contact resistance following connection of a wire to the source/drain region by ion-implanting the second conductive type impurity into a prescribed region of the surface of the source/drain region, while the step of forming the contact region is preferably carried out substantially through the same step as the step of ion-implanting the second conductive type impurity into the first impurity region. According to this structure, the fabrication step of forming the diode can be partially shared with the fabrication step of forming the transistor of the peripheral circuit, whereby the fabrication process can be inhibited from remarkable complication also when forming the diode on the memory cell array region.

A memory according to a third aspect of the present invention comprises a memory cell array region including a plurality of memory cells arranged in the form of a matrix, a selection transistor including a first selection transistor and a second selection transistor provided for the plurality of memory cells respectively, a first impurity region functioning as an electrode partially constituting each memory cell while functioning also as one of source/drain regions of the selection transistor and a word line provided on the memory cell array region along the first impurity region. A first gate electrode of the first selection transistor and a second gate electrode of the second selection transistor are provided integrally with the word line and arranged to obliquely intersect with the longitudinal direction of the first impurity region on regions formed with the first selection transistor and the second selection transistor.

In the memory according to the third aspect of the present invention, as hereinabove described, the first gate electrode of the first selection transistor and the second gate electrode of the second selection transistor are provided integrally with the word line and arranged to obliquely intersect with the longitudinal direction of the first impurity region on the region formed with the first selection transistor and the second selection transistor, whereby the interval between word lines adjacent to each other perpendicularly to the direction along the first impurity region can be further reduced as compared with a case of constituting the gate electrode by partially arranging the word line to be perpendicular to the direction along the first impurity region. Thus, the memory cell size can be reduced. Further, the gate electrode of the selection transistor common to the plurality of memory cells can be constituted with the word line by providing the first and second gate electrodes of the first and second selection transistors provided for the plurality of memory cells respectively integrally with the word line, whereby load capacity of the word line can be remarkably reduced as compared with a case of constituting a gate electrode of a selection transistor with the word line every memory cell. Thus, the word line can be driven at a high speed.

In the aforementioned memory according to the third aspect, the first impurity region is preferably divided on regions corresponding to the first selection transistor and the second selection transistor. According to this structure, resistance of the first impurity region can be inhibited from increase resulting from an increased length of the first impurity region. Thus, resistance loss of a current flowing through the first impurity region can be inhibited from increase.

In this case, two word lines provided along divided portions of the first impurity region respectively are preferably connected with each other through the first gate electrode and the second gate electrode. According to this structure, the word lines can be singly linked with the divided portions of the first impurity region, whereby the number of word lines can be inhibited from increase dissimilarly to a case of providing word lines for the plurality of divided portions of the first impurity region respectively.

In the aforementioned memory according to the third aspect, the first selection transistor and the second selection transistor preferably share the other one of the source/drain regions. According to this structure, the memory cell size can be further reduced as compared with a case of individually providing the other one of the source/drain regions in each of the first and second selection transistors.

In the aforementioned memory according to the third aspect, the first impurity region and the other one of the source/drain regions are formed by introducing an impurity into a semiconductor substrate through the first gate electrode and the second gate electrode serving as masks. According to this structure, the first impurity region and the other one of the source/drain regions can be simultaneously formed through a single step of introducing the impurity into the semiconductor substrate, whereby the fabrication process can be simplified.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

First Embodiment

The structure of a mask ROM according to a first embodiment of the present invention is described with reference to FIGS. 1 to 4.

Figure 1:
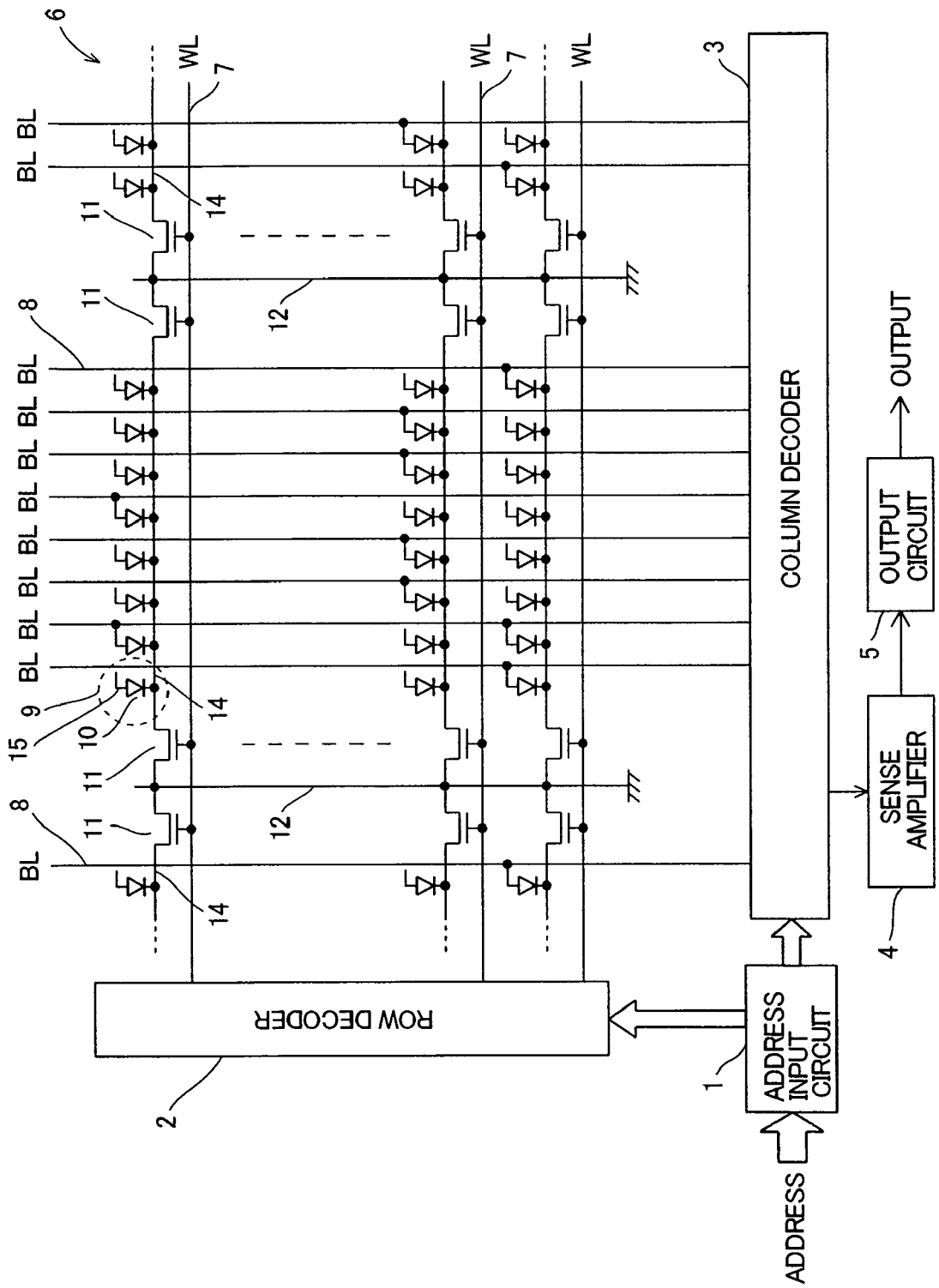
FIG. 1 is a circuit diagram showing the structure of a mask ROM according to a first embodiment of the present invention.

As shown in FIG. 1, the mask ROM according to the first embodiment comprises an address input circuit 1, a row decoder 2, a column decoder 3, a sense amplifier 4, an output circuit 5 and a memory cell array 6. The address input circuit 1, the row decoder 2, the column decoder 3, the sense amplifier 4 and the output circuit 5 constitute a peripheral circuit. The address input circuit 1 externally receives a prescribed address, thereby outputting address data to the row decoder 2 and the column decoder 3. A plurality of word lines (WL) 7 are connected to the row decoder 2. The row decoder 2 receives the address data from the address input circuit 1, thereby selecting a word line 7 corresponding to the received address data and raising the potential of the selected word line 7 to a high level. A plurality of bit lines (BL) 8 are connected to the column decoder 3. The column decoder 3 receives the address data from the address input circuit 1, thereby selecting a bit line 8 corresponding to the received address data and connecting the selected bit line 8 to the sense amplifier 4. The sense amplifier 4 determines and amplifies the potential of the bit line 8 selected by the column decoder 3, for outputting a high-level signal when the potential of the selected bit line 8 is at a low level while outputting a low-level signal when the potential of the selected bit line 8 is at a high level. The sense amplifier 4 includes a load circuit (not shown) raising the potential of the selected bit line 8 to a high level when the potential of this bit line 8 is not at a low level. The output circuit 5 receives the output from the sense amplifier 4, thereby outputting a signal.

A plurality of memory cells 9 are arranged on the memory cell array 6 in the form of a matrix. Each memory cell 9 includes a diode 10. The memory cell array 6 is provided with memory cells 9 including diodes 10 having anodes connected to the corresponding bit lines 8 and memory cells 9 including diodes 10 having anodes connected to none of the bit lines 8. Each memory cell 9 stores data "0" or "1" in response to whether or not the anode of the diode 10 is connected to the corresponding the bit line 8. The cathodes of the diodes 10 are connected to the drains of selection transistors 11 consisting of n-channel transistors. The selection transistors 11 have sources grounded through source lines (GND lines) 12 and gates connected to the word lines 7.

Figure 2:
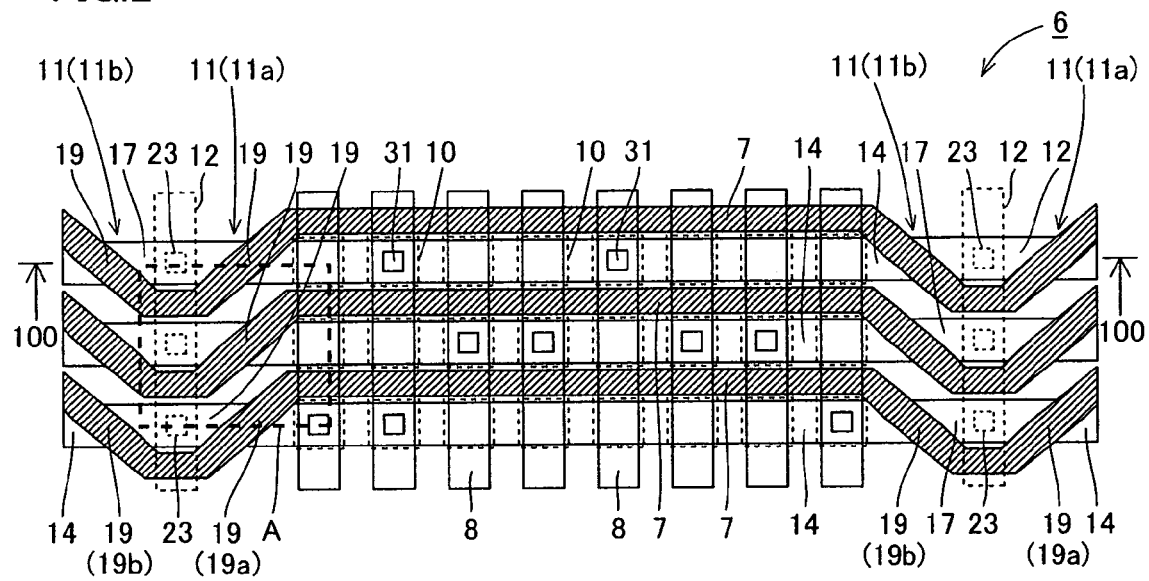
FIG. 2 is a plane layout diagram showing the structure of the mask ROM according to the first embodiment shown in FIG. 1.
Figure 3:
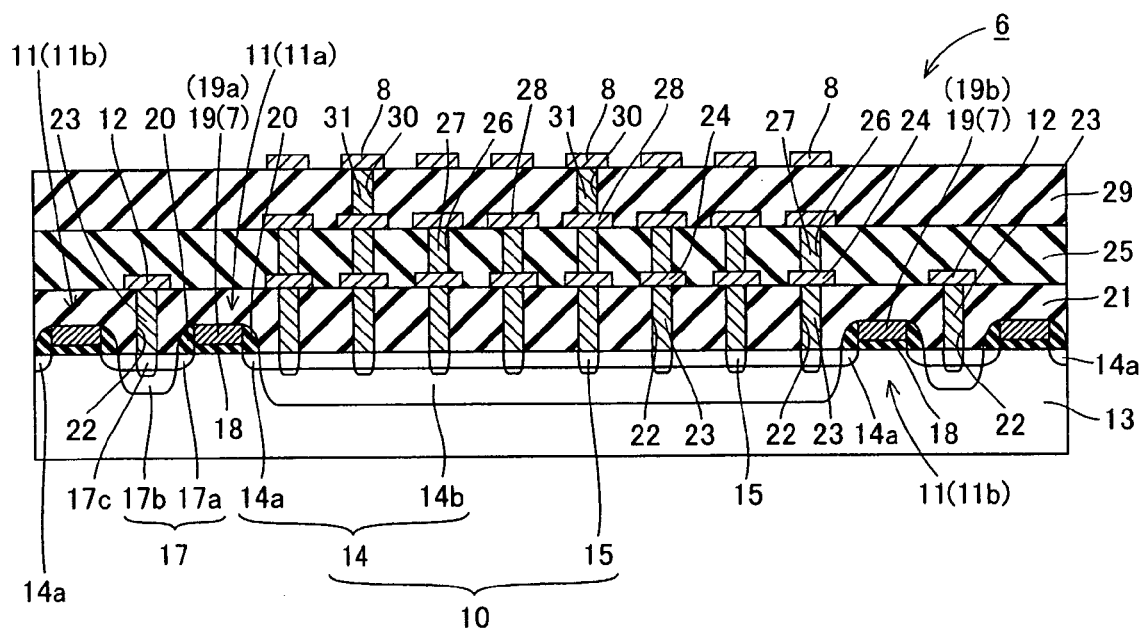
FIG. 3 is a sectional view of the mask ROM according to the first embodiment taken along the line 100-100 in FIG. 2.

In the memory cell array 6, a plurality of n-type impurity regions 14 are provided on the upper surface of a p-type silicon substrate 13 at prescribed intervals, as shown in FIGS. 2 and 3. The p-type silicon substrate 13 is an example of the "semiconductor substrate" in the present invention, and each n-type impurity region 14 is an example of the "first impurity region" in the present invention. As shown in FIG. 3, each n-type impurity region 14 is constituted of an n-type low-concentration impurity region 14a and an n-type impurity region 14b formed deeper than the impurity region 14a. The impurity region 14a is an example of the "fourth impurity region" in the present invention, and the impurity region 14b is an example of the "fifth impurity region" in the present invention. The impurity region 14b has an impurity concentration slightly higher than that of the impurity region 14a.

According to the first embodiment, a plurality of (eight) p-type impurity regions 15 are formed in each n-type impurity region 14 at prescribed intervals. The p-type impurity regions 15 are examples of the "second impurity regions" in the present invention. Each p-type impurity region 15 and the corresponding n-type impurity region 14 form the diode 10. Thus, each n-type impurity region 14 is employed as a common cathode of a plurality of diodes 10. Further, each p-type impurity region 15 is employed as the anode of the corresponding diode 10. A plurality of (eight) diodes 10 are formed in each n-type impurity region 14. In other words, each n-type impurity region 14 is employed in common for the plurality of (eight) diodes 10. When the silicon substrate 13 is included in the structure of each diode 10, a pnp bipolar transistor is parasitically constituted. In this case, the p-type impurity region 15 and the n-type impurity region 14 functioning as the anode and the cathode of the diode 10 linked to the corresponding bit line 8 respectively and the p-type silicon substrate 13 function as the emitter, the base and the collector of the bipolar transistor respectively.

According to the first embodiment, the n-type impurity region 14 is employed also as the drain region of each selection transistor 11 (11a or 11b). The selection transistor 11a is an example of the "first selection transistor" in the present invention, and the selection transistor 11b is an example of the "second selection transistor" in the present invention. According to the first embodiment, each of the selection transistors 11a and 11b is provided for eight diodes 10 (memory cells 9). Source regions 17 of the selection transistors 11 (11a and 11b) are formed on both sides of the n-type impurity regions 14 at prescribed intervals. Each source region 17 is shared by each selection transistor 11a provided for prescribed eight memory cells 9 (diodes 10) and each selection transistor 11b provided for other eight memory cells 9 (diodes 10) adjacent to the prescribed eight memory cells 9 (diodes 10). Each source region 17 includes an n-type low-concentration impurity region 17a and an n-type high-concentration impurity region 17b. The n-type low-concentration impurity region 17a is an example of the "third impurity region" in the present invention. The n-type low-concentration impurity region 17a is formed on a relatively shallow region of the surface of the p-type silicon substrate 13, while the n-type high-concentration impurity region 17b is formed on a region deeper than the n-type low-concentration impurity region 17a. Thus, the source region 17 has an LDD (lightly doped drain) structure consisting of the n-type low- and high-concentration impurity regions 17a and 17b. In this source region 17, an n-type contact region 17c is formed in the n-type low- and high-concentration impurity regions 17a and 17b. This n-type contact region 17c is provided for reducing contact resistance when a first plug 23 described later is connected to the source region 17.

According to the first embodiment, the impurity concentrations of the n-type low-concentration impurity region 17a of each source region 17 and the impurity region 14a of each n-type impurity region 14 are identical to each other. Further, the impurity concentration of the n-type high-concentration impurity region 17b of the source region 17 is higher than that of the impurity region 14b of the n-type impurity region 14. In the memory cell array 6, each pair of adjacent n-type impurity regions 14 are arranged at prescribed intervals from the source region 17 common to two selection transistors 11 (11a and 11b) respectively. In other words, the n-type impurity regions 14 are divided on regions of the p-type silicon substrate 13 corresponding to the two selection transistors 11.

A gate electrode 19 (19a or 19b) is formed on a channel region of the p-type silicon substrate 13 between each n-type impurity region 14 and each source region 17 through a gate insulating film 18. The gate electrode 19 (19a or 19b) is formed integrally with the corresponding word line 7 of a polysilicon film, as shown in FIG. 2. The gate electrode 19a is an example of the "first gate electrode" in the present invention, and the gate electrode 19b is an example of the "second gate electrode" into contact with the adjacent word lines 7. The width t3 of a portion of each word line 7 along the longitudinal direction of each n-type impurity region 14 is rendered smaller than the width t2 of the portion around the central portion of each gate electrode 19. The widths t1, t2 and t3 of the portions of the word line 7 are in the following relation:

t2>t1≈t3

As shown in FIG. 3, side wall spacers 20 of insulating films are provided on both sides of each gate electrode 19 (19a or 19b). A first interlayer dielectric film 21 is provided on the upper surface of the p-type silicon substrate 13, to cover the gate electrodes 19 (word lines 7) and the side wall spacers 20. Contact holes 22 are provided in regions of the first interlayer dielectric film 21 corresponding to the p-type impurity regions 15 and the n-type contact regions 17c. The contact holes 22 are examples of the "openings" in the present invention. First plugs 23 of W (tungsten) are embedded in the contact holes 22. Thus, the plugs 23 are connected to the p-type impurity regions 15 and the n-type contact regions 17c.

As shown in FIG. 3, further, the source lines 12 of Al and first connection layers 24 are provided on the first interlayer insulating film 21, to be connected to in the present invention.

Figure 4:
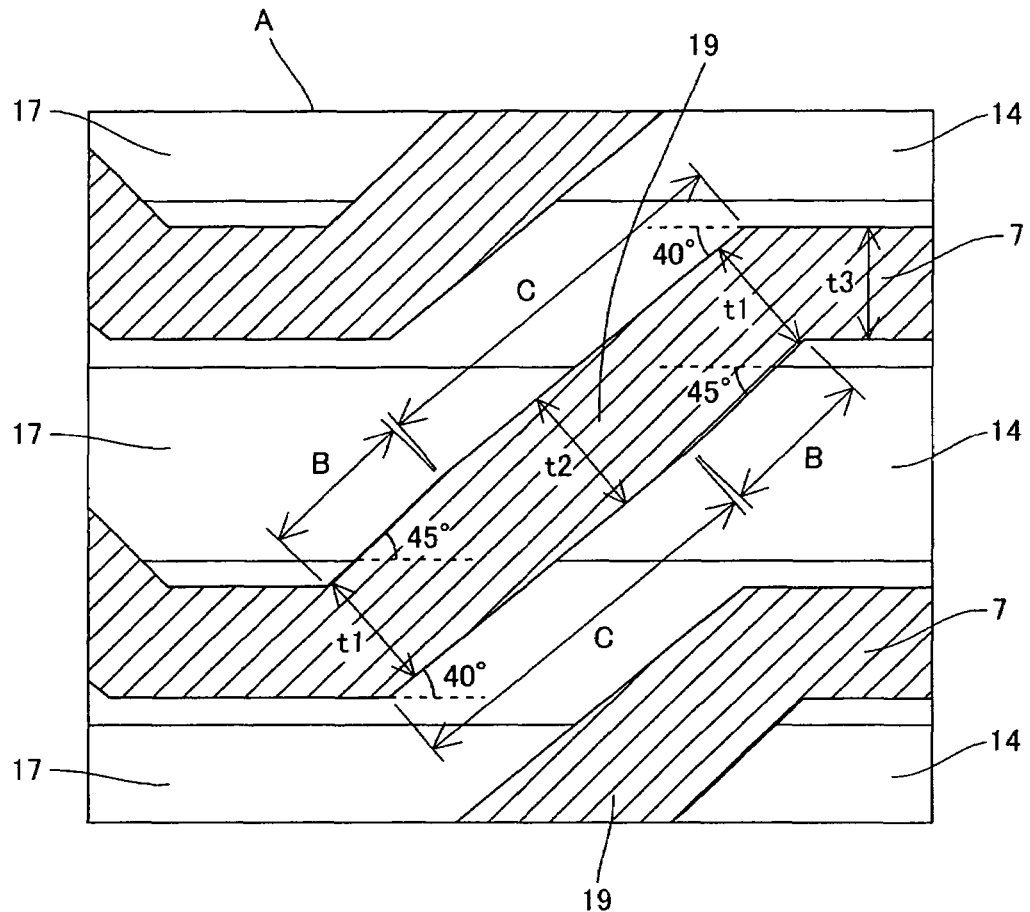
FIG. 4 is an enlarged plan view of a region A, shown by broken lines in FIG. 2, of the mask ROM according to the first embodiment.

The plurality of word lines 7 are provided at prescribed intervals, as shown in FIG. 2. The gate electrodes 19 (19a and 19b) are formed by partially bending the word lines 7 to obliquely intersect with the direction along the n-type impurity regions 14, as shown in FIG. 2. The gate electrodes 19 (19a and 19b), the n-type impurity regions 14 and the source regions 17 constitute the selection transistors 11 (11a and 11b). As shown in FIG. 4, two opposite edges of each gate electrode 19 are constituted of portions B and C having angles of about 45° and about 40° respectively in the direction along each n-type impurity region 14 in plan view. Thus, the width t1 of a portion around a bent portion of each word line 7 is smaller than the width t2 of a portion around the central portion of each gate electrode 19. On each edge of the gate electrode 19, the portion B having the angle of about 45° is rendered shorter than the portion C having the angle of about 40°. According to this structure, the portions having the angle of about 40° around the bent portions of each word line 7 having the width t1 are opposed to the portions of adjacent word lines 7 having the angle of about 45° respectively while increasing the intervals between the adjacent word lines 7, whereby the bent portion of each word line 7 is inhibited from coming the first plugs 23. In addition, a second interlayer dielectric film 25 is provided on the first interlayer dielectric film 21, to cover the source lines 12 and the first connection layers 24. Contact holes 26 are formed in regions of the second interlayer dielectric film 25 corresponding to the first connection layers 24. Second plugs 27 of W are embedded in the contact holes 26.

Second connection layers 28 of Al are provided on the second interlayer dielectric film 25, to be connected to the second plugs 27. A third interlayer dielectric film 29 is provided on the second interlayer dielectric film 25, to cover the second connection layers 28. Contact holes 30 are provided in the third interlayer dielectric film 29, and third plugs 31 of W are embedded in the contact holes 30. The third plugs 31 are connected to the second connection layers 29. The plurality of bit lines 8 of Al are provided on the third interlayer dielectric film 29 at prescribed intervals. The bit lines 8 are connected to the third plugs 31. The third plugs 31 are provided between those of the second connection layers 28 linked with prescribed p-type impurity regions 15 (anodes of the diodes 10) and the corresponding bit lines 8, while no third plugs 31 are provided between the second connection layers 28 linked with the remaining p-type impurity regions 15 (anodes of the diodes 10) and the corresponding bit lines 8. Thus, the diodes 10 include those having anodes connected to the corresponding bit lines 8 and those having anodes connected to none of the bit lines 8. In other words, the mask ROM according to the first embodiment stores data "0" or "1" in response to whether or not the contact holes 30 are provided on the third interlayer dielectric film 29.

Operations of the mask ROM according to the first embodiment are now described with reference to FIG. 1. First, a prescribed address is input in the address input circuit 1. Thus, the address input circuit 1 outputs address data responsive to the input address to the row decoder 2 and the column decoder 3 respectively. The row decoder 2 decodes the address data, thereby selecting a prescribed word line 7 corresponding to the address data. The potential of the selected word line 7 goes high, thereby turning on the selection transistor 11 having the gate connected to the selected word line 7. Therefore, the potential of the drain of the selection transistor 11 is lowered to the GND level (low level), thereby also lowering the potential of the cathode of the diode 10 employed in common with the drain of the selection transistor 11 to the GND level (low level). At this time, the potentials of the nonselected word lines 7 are held at low levels. Thus, the selection transistors 11 linked with the nonselected word lines 7 are held in OFF states, whereby the cathodes of the diodes 10 linked with the nonselected word lines 7 enter open states.

On the other hand, the column decoder 3 receiving the address data from the address input circuit 1 selects a prescribed bit line 8 corresponding to the received address data and connects the selected bit line 8 to the sense amplifier 4. If the anode of the diode 10 of a selected memory cell 9 corresponding to the selected word line 7 and the selected bit line 8 is linked with this bit line 8, the potential of the bit line 8 is reduced to a low level through the diode 10. Thus, the low-level potential of the bit line 8 is transmitted to the sense amplifier 4. The sense amplifier 4 determines and amplifies the potential of the bit line 8, and thereafter outputs a high-level signal of reverse polarity to the low-level potential of the bit line 8. The output circuit 5 receiving the output signal from the sense amplifier 4 outputs the high-level signal. If the anode of the diode 10 of the selected memory cell 9 corresponding to the selected word line 7 and the selected bit line 8 is not linked with the bit line 8, on the other hand, no low-level potential is transmitted to the sense amplifier 4. In this case, the load circuit (not shown) provided in the sense amplifier 4 raises the potential of the bit line 8 to a high level. Thus, the sense amplifier 4 determines and amplifies the potential of the bit line 8, and thereafter outputs a high-level signal of reverse polarity to the low-level potential of the bit line 8. The output circuit 5 receiving the output signal from the sense amplifier 4 outputs the high-level signal.

Figure 5:
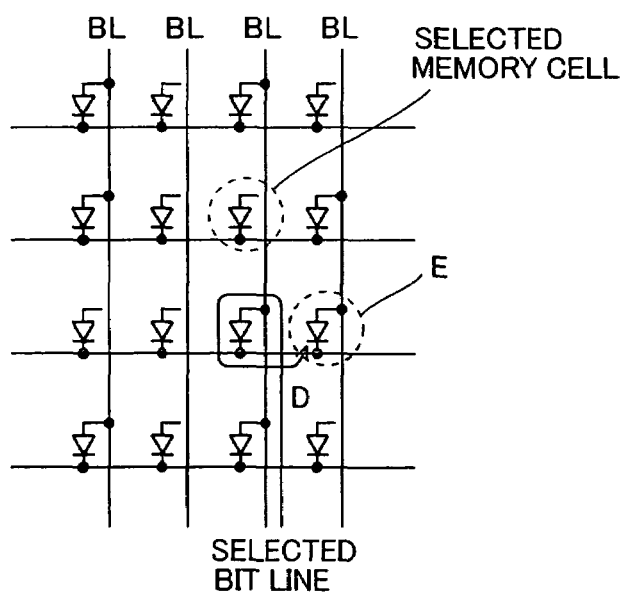
FIGS. 5 and 6 are circuit diagrams for illustrating effects of the mask ROM according to the first embodiment of the present invention.
Figure 6:
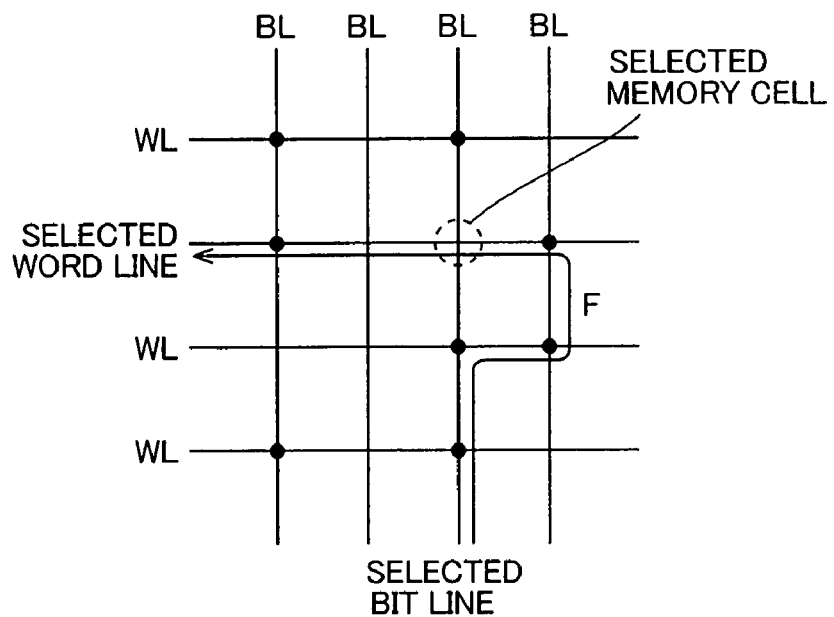

In the mask ROM according to the first embodiment, each memory cell 9 is so provided with the diode 10 as to suppress false data reading resulting from a circumventive current. More specifically, a diode E shown in FIG. 5 suppresses flow of a current when the current flows along arrow D in data reading from a selected memory cell, as shown in FIG. 5. If the memory cell 9 is provided with no diode 10, however, a current flows along arrow F while circumventing another bit line in addition to a selected bit line, as show in FIG. 6. In this case, it is impossible to determine whether or not data read through the selected bit line is that stored in the selected memory cell, leading to false data reading. On the other hand, the mask ROM according to the first embodiment allows no current circumvention, to read data only from the selected memory cell 9. Thus, the mask ROM suppresses false data reading.

When the silicon substrate 13 is included in the structure of each diode 10 in the first embodiment, the pnp bipolar transistor is parasitically constituted while the p-type impurity region 15, the n-type impurity region 14 and the p-type silicon substrate 13 function as the emitter, the base and the collector of the bipolar transistor respectively. Thus, an operation of forwardly feeding a current through the diode 10 corresponds to an operation of feeding the current between the emitter and the base of the bipolar transistor. In this case, the current also flows between the emitter (p-type impurity region 15) and the collector (p-type silicon substrate 13) of the bipolar transistor. Thus, the current flowing through the bit line 8 corresponds to the sum of the current flowing between the emitter (p-type impurity region 15) and the base (n-type impurity region 14) and that flowing between the emitter (p-type impurity region 15) and the collector (p-type silicon substrate 13). The current flowing between the emitter and the collector is generated when the current flows between the emitter and the base, and hence it follows that a cell current flowing through the memory cell 9 (diode 10) is amplified. According to the first embodiment, therefore, the current flowing through the bit line 8 is inhibited from reduction by amplification of the current flowing from the p-type impurity region 15 to the p-type silicon substrate 13 also when the quantity of the current flowing from the p-type impurity region 15 serving as the anode to the impurity region 14a of the n-type impurity region 14 is reduced due to high resistance of the n-type impurity region 14 serving as the cathode of the diode 10.

A fabrication process for the mask ROM according to the first embodiment is now described with reference to FIGS. 2, 3 and 7 to 13. Steps of forming wells and element separation regions (LOCOS and STI structures etc.) on the p-type silicon substrate 13 are omitted from the following description of the fabrication process.

Figure 7:
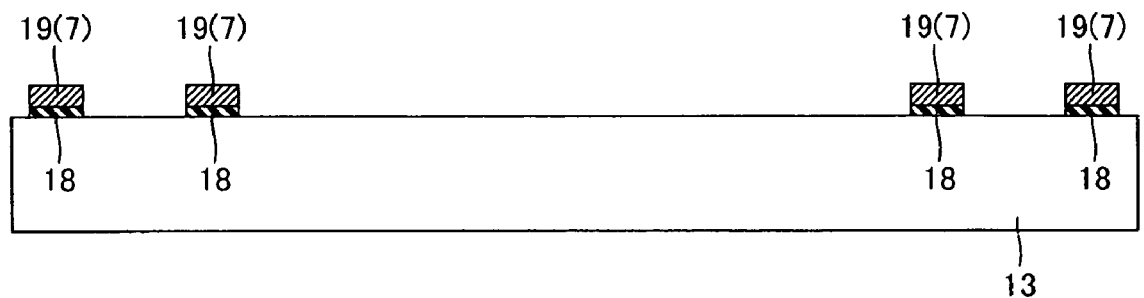
FIGS. 7 to 13 are sectional views for illustrating a fabrication process for the mask ROM according to the first embodiment of the present invention.

As shown in FIG. 7, the word lines 7 (gate electrodes 19) of polysilicon are formed on the upper surface of the p-type silicon substrate 13 through the gate insulating films 18. The plurality of word lines 7 are formed at the prescribed intervals in plan view, as shown in FIG. 2.

Figure 8:
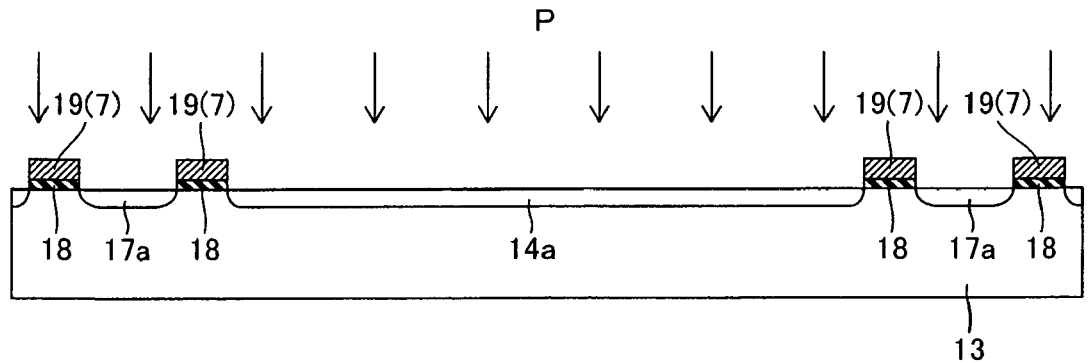

As shown in FIG. 8, P (phosphorus) is ion-implanted into prescribed regions of the p-type silicon substrate 13 under conditions of implantation energy of about 50 keV and a dose (quantity of implantation) of about $3.0 \times 10^{13}$ cm$^{-2}$ through the gate electrodes 19 serving as masks. Thus formed are the low-concentration impurity regions 14a of the n-type impurity regions 14 and the n-type low-concentration impurity regions 17a divided along the regions corresponding to the gate electrodes 19.

Figure 9:
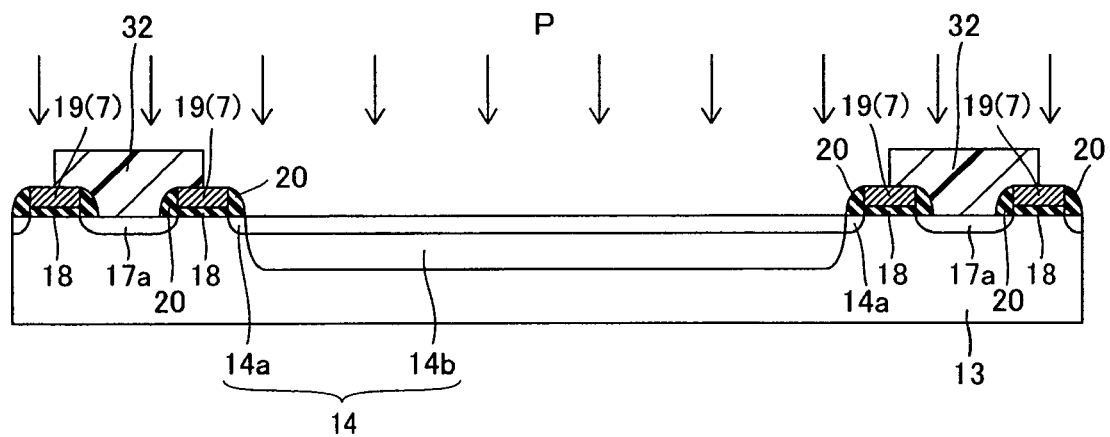

As shown in FIG. 9, an insulating film is formed to cover the overall surface and thereafter anisotropically etched, thereby forming the side wall spacers 20 of insulating films on the side surfaces of the gate electrodes 19. Thereafter resist films 32 are formed to cover the n-type low-concentration impurity regions 17a, for thereafter ion-implanting P (phosphorus) through the gate electrodes 19, the side wall spacers 20 and the resist films 32 serving as masks under conditions of implantation energy of about 100 keV and a dose of about $3.5 \times 10^{13}$ cm$^{-2}$. Thus, the n-type impurity regions 14b having the impurity concentration slightly higher than that of the impurity regions 14a are formed on regions corresponding to the n-type low-concentration impurity regions 14a. The impurity regions 14b are formed up to regions deeper than the impurity regions 14a. The impurity regions 14a and 14b constitute the n-type impurity regions 14.

Figure 10:
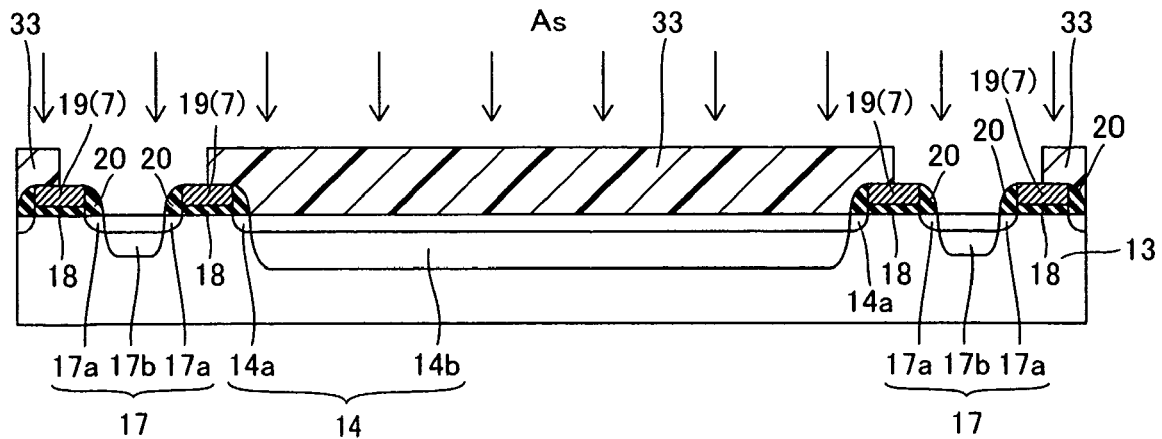

As shown in FIG. 10, resist films 33 are formed to cover the n-type impurity regions 14. Thereafter As is ion-implanted under conditions of implantation energy of about 70 keV and a dose of about $5.0 \times 10^{15}$ cm$^{-2}$ through the gate electrodes 19, the side wall spacers 20 and the resist films 33 serving as masks. Thus, the n-type high-concentration impurity regions 17b having the impurity concentration higher than that of the n-type low-concentration impurity regions 17a are formed on regions corresponding to the n-type low-concentration impurity regions 17a. The n-type high-concentration impurity regions 17b are formed up to regions deeper than the n-type low-concentration impurity regions 17a. The n-type low-concentration impurity regions 17a and the n-type high-concentration impurity regions 17b form the n-type source regions 17 having the LDD structure.

Figure 11:
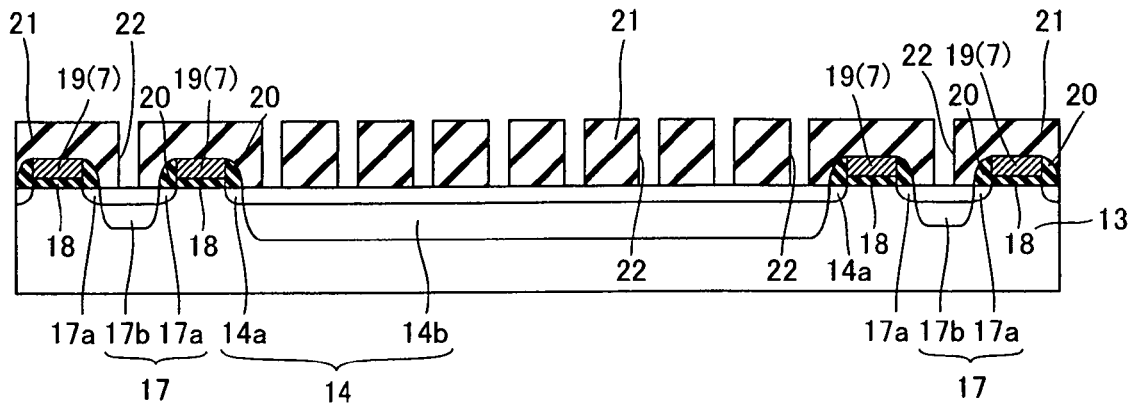

As shown in FIG. 11, the first interlayer dielectric film 21 is formed on the p-type silicon substrate 13, to cover the gate electrodes 19 (word lines 7) and the side wall spacers 20. Thereafter the contact holes 22 are formed in the regions of the first interlayer dielectric film 21 corresponding to the source regions 17 and the n-type impurity regions 14 by photolithography and dry etching.

Figure 12:
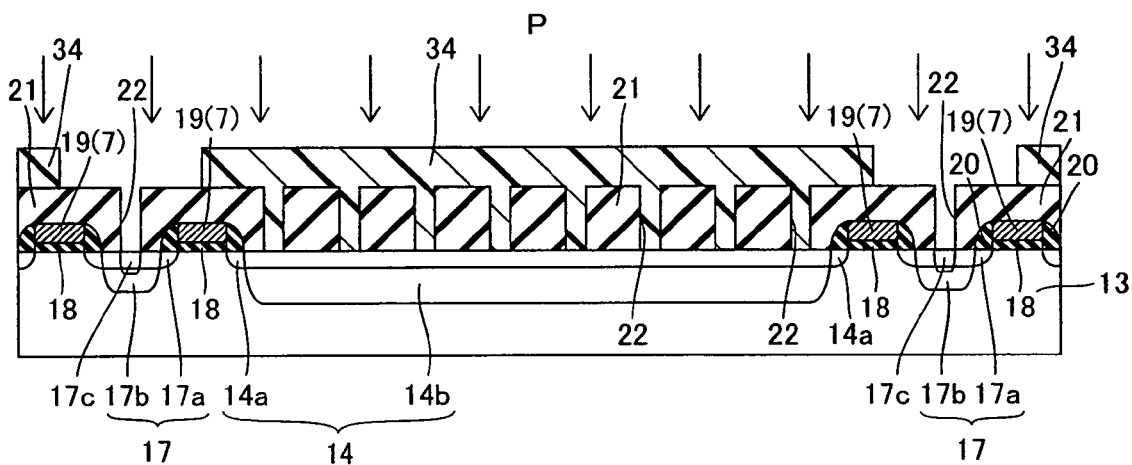

As shown in FIG. 12, resist films 34 are formed to cover the regions of the first interlayer dielectric film 21 corresponding to the n-type impurity regions 14. Thereafter P (phosphorus) is ion-implanted into the source regions 17 under conditions of implantation energy of about 25 keV and a dose of about $3.0 \times 10^{14}$ cm$^{-2}$ through the contact holes 22, thereby forming the n-type contact regions 17c.

Figure 13:
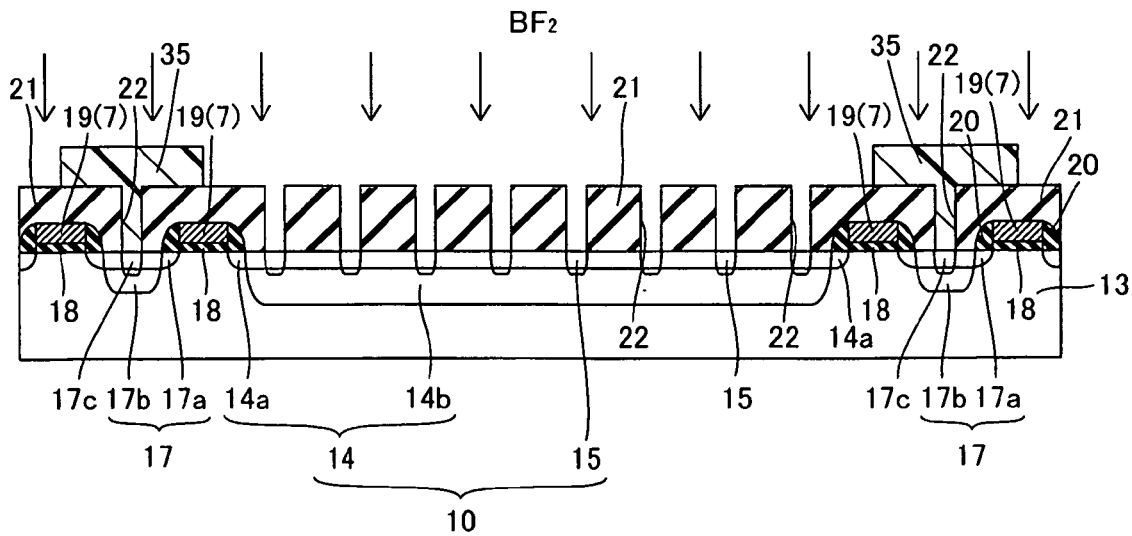

As shown in FIG. 13, resist films 35 are formed to cover the regions of the first interlayer dielectric film 21 corresponding to the source regions 17. Thereafter BF$_2$ is ion-implanted into the n-type impurity regions 14 under conditions of implantation energy of about 40 keV and a dose of about $2.0 \times 10^{15}$ cm$^{-2}$ through the contact holes 22. Thus, the plurality of (eight) p-type impurity regions 15 are formed in each n-type impurity region 14 in correspondence to the contact holes 22. The plurality of (eight) p-type impurity regions 15 and the n-type impurity region 14 form the plurality of (eight) diodes 10 in the n-type impurity region 14. The p-type impurity regions 15 are formed up to regions slightly deeper than the impurity regions 14a of the n-type impurity region 14.

As shown in FIG. 3, the first plugs 23 of W are formed to fill up the contact holes 22. Thus, the first plugs 23 are connected to the p-type impurity regions 15 and the n-type contact regions 17c of the source regions 17 respectively. Then, the first connection layers 24 of Al are formed on the first interlayer dielectric film 21 to be connected to the plugs 23 linked with the p-type impurity regions 15, while the source lines 12 of Al are formed to be connected to the plugs 23 linked with the source regions 17. The second interlayer dielectric film 25 is formed on the first interlayer dielectric film 21 to cover the first connection layers 24 and the source lines 12, and the contact holes 26 are thereafter formed in the regions corresponding to the first connection layers 24. The second plugs 27 of W are embedded in the contact holes 26. The second connection layers 28 of Al are formed on the second interlayer dielectric film 25, to be connected to the second plugs 27. Thereafter the third interlayer dielectric film 29 is formed on the second interlayer dielectric film 25, to cover the second connection layers 28.

The contact holes 30 are formed in the regions of the third interlayer dielectric film 29 corresponding to the second connection layers 28, while the third plugs 31 of W are embedded in the contact holes 30. At this time, the contact holes 30 and the third plugs 31 are provided for the p-type impurity regions 15 connected to the corresponding bit lines 8, while neither contact holes 30 nor third plugs 31 are provided for the p-type impurity regions 15 connected to none of the bit lines 8. Finally, the bit lines 8 of Al are formed on the third interlayer dielectric film 29. Thus, the second connection layers 28 and the bit lines 8 are connected with each other through the third plugs 31 on the regions provided with the third plugs 31, whereby the p-type impurity regions 15 linked with the second connection layers 28 are connected to the bit lines 8. On the regions provided with no third plugs 31, on the other hand, the second connection layers 28 and the bit lines 8 are not connected with each other and hence the p-type impurity regions 15 are connected to none of the bit lines 8. Thus, the diodes 10 include those having the anodes (p-type impurity regions 15) connected to the bit lines 8 corresponding to either data "0" or "1" and those having the anodes (p-type impurity regions 15) connected to none of the bit lines 8 corresponding to either the data "1" or "0". The memory cell array 6 of the mask ROM according to the first embodiment is formed in the aforementioned manner, as shown in FIG. 3.

Figure 28:
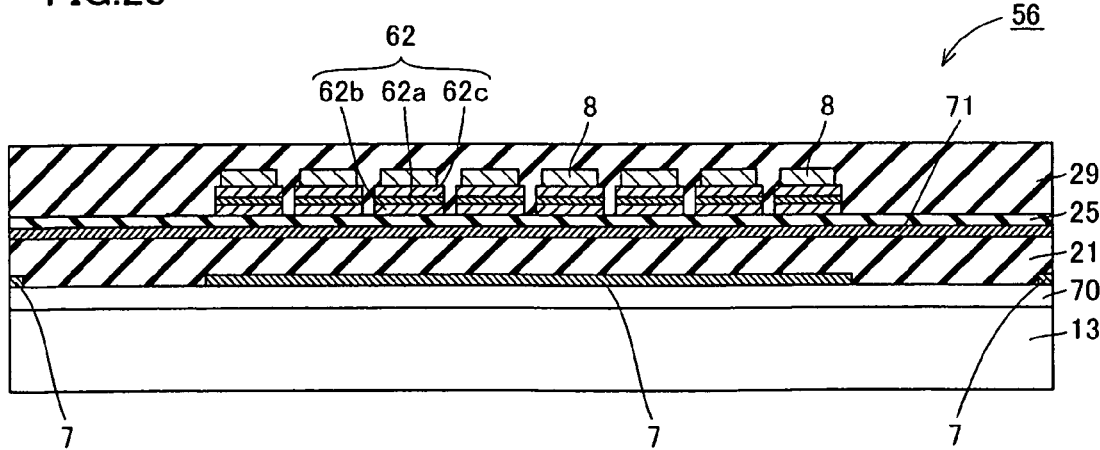
FIG. 28 is another sectional view of the memory cell array of the MRAM according to the second embodiment taken along the line 200-200 in FIG. 26.

According to the first embodiment, as hereinabove described, the diodes 10 consisting of the n-type impurity regions 14 and the p-type impurity regions 15 are so formed on the upper surface of the p-type silicon substrate 13 that each memory cell 9 includes a single diode 10, whereby the memory cell size can be more reduced as compared with the conventional mask ROM (see FIG. 28) having the memory cells each including a single transistor.

According to the first embodiment, the plurality of p-type impurity regions 15 are so formed on the surface of each n-type impurity region 14 that the plurality of diodes 10 can be formed on each n-type impurity region 14, whereby the n-type impurity region 14 can be employed in common for the plurality of diodes 10. Thus, the structure of and the fabrication process for the memory cell array 6 can be simplified.

According to the first embodiment, further, the contact holes 22 employed for ion-implanting BF$_2$ for forming the p-type impurity regions 15 in the n-type impurity regions 14 are also employed for connecting the plugs 23 to the p-type impurity regions 15 after the ion implantation of BF$_2$ so that no contact holes may be separately formed for connecting the plugs 23 to the p-type impurity regions 15, whereby the fabrication step for forming the plugs 23 connected to the p-type impurity regions 15 can be simplified.

According to the first embodiment, further, the n-type impurity regions 14 are employed in common as the drain regions of the selection transistors 11 and the cathodes of the diodes 10 so that the drain regions of the selection transistors 11 and the cathodes of the diodes 10 can be formed through the single step of forming the n-type impurity regions 14, whereby the fabrication process can be simplified.

According to the first embodiment, further, the n-type impurity regions 14 are so divided on the regions corresponding to the selection transistors 11 that resistance of the n-type impurity regions 14 can be inhibited from increase resulting from an increased length of the n-type impurity regions 14, whereby the current flowing through the n-type impurity regions 14 can be inhibited from increase of resistance loss.

According to the first embodiment, further, the n-type low-concentration impurity regions 17a of the source regions 17 of the selection transistors 11 are formed to have the same impurity concentration as the impurity regions 14a of the n-type impurity regions 14 so that the impurity regions 14a of the n-type impurity regions 14 can be formed through the same step as that for the n-type low-concentration impurity regions 17a of the selection transistors 11, whereby the fabrication process for the diodes 10 constituting the memory cells 9 can be simplified when constituting the source regions 17 of the selection transistors 11 in the LDD structure consisting of the n-type low-concentration impurity regions 17a and the n-type high-concentration impurity regions 17b.

According to the first embodiment, further, the gate electrodes 19a and 19b of the selection transistors 11a and 11b are provided integrally with the word lines 7 and arranged to obliquely intersect with the longitudinal direction of the n-type impurity regions 14 on the regions formed with the selection transistors 11a and 11b, whereby the intervals between prescribed word lines 7 and the word lines 7 adjacent thereto can be reduced while inhibiting the prescribed word lines 7 from coming into contact with the adjacent word lines 7 as compared with a case of partially arranging the word lines 7 perpendicularly to the direction along the n-type impurity regions 14 for forming the gate electrodes 19. Thus, the memory cell size can be further reduced.

According to the first embodiment, further, the gate electrodes 19a and 19b of the selection transistors 11a and 11b each provided for eight memory cells 9 (diodes 10) are provided integrally with the word lines 7 so that the gate electrodes 19a and 19b of the selection transistors 11a and 11b each common to eight memory cells 9 (diodes 10) can be constituted with the word lines 7, whereby the load capacity of the word lines 7 can be remarkably reduced as compared with a case of forming the gate electrode of a selection transistor every memory cell with each word line. Thus, the word lines 7 can be driven at a high speed.

According to the first embodiment, further, portions of the word lines 7 provided along the divided n-type impurity regions 14 respectively are so connected through the gate electrodes 19a and 19b that the word lines 7 can be singly linked to the plurality of divided n-type impurity regions 14, whereby the number of the word lines 7 can be inhibited from increase dissimilarly to a case of individually providing word lines for the plurality of divided n-type impurity regions 14.

According to the first embodiment, further, each selection transistor 11a provided for prescribed eight memory cells 9 (diodes 10) and each selection transistor 11b provided for other eight memory cells 9 (diodes 10) adjacent to the prescribed eight memory cells 9 (diodes 10) share the corresponding source region 17, whereby the memory cell size can be further reduced as compared with a case of individually providing source regions in the selection transistors 11a and 11b.

According to the first embodiment, further, the n-type impurity regions 14 and the source regions 17 are formed by performing ion implantation into the p-type silicon substrate 13 through the gate electrodes 11a and 11b serving as masks so that the n-type impurity regions 14 and the source regions 17 can be formed through a common ion implantation step, whereby the fabrication process can be simplified.

The structure of a mask ROM according to a modification of the first embodiment is now described with reference to FIG. 14. The modification of the first embodiment is described with reference to a case of rendering a fabrication process for selection transistors 41 of a memory cell array and a fabrication process for a low withstand voltage n-channel transistor 42, a low withstand voltage p-channel transistor 44 and a high withstand voltage transistor 43 provided on a peripheral circuit partially in common.

Figure 14:
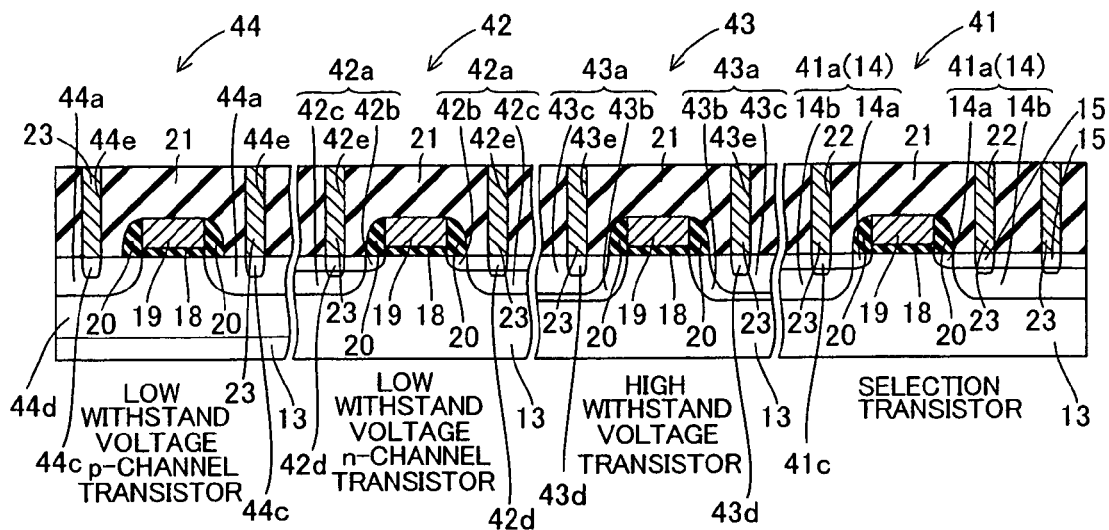
FIG. 14 is a sectional view for illustrating the structure of a mask ROM according to a modification of the first embodiment of the present invention.

As shown in FIG. 14, the mask ROM according to the modification of the first embodiment comprises the low withstand voltage n-channel transistor 42 having a prescribed withstand voltage, the high withstand voltage transistor 43 having a withstand voltage higher than that of the low withstand voltage n-channel transistor 42 and a low withstand voltage p-channel transistor 44 having a prescribed withstand voltage provided in the peripheral circuit, in addition to a selection transistor 41. The low withstand voltage n-channel transistor 42 and the high withstand voltage transistor 43 are examples of the "transistor" in the present invention.

The selection transistor 41 has n-type source/drain regions 41a similar in structure to the n-type impurity regions 14 in the aforementioned first embodiment. The drain regions of the selection transistor 41 are formed with p-type impurity regions 15. Thus, diodes consisting of n-type impurity regions 14 and the p-type impurity regions 15 are formed in the drain regions of the selection transistor 41. On the other hand, n-type contact regions 41c for reducing contact resistance with first plugs 23 (see FIG. 3) are formed in the source regions of the selection transistor 41. The low withstand voltage n-channel transistor 42 includes n-type source/drain regions 42a having n-type low-concentration impurity regions 42b containing P (phosphorus) and n-type high-concentration impurity regions 42c containing As. The n-type low-concentration impurity regions 42b are examples of the "sixth impurity regions" in the present invention. The n-type low-concentration impurity regions 42b and the n-type high-concentration impurity regions 42c form an LDD structure.

The n-type source/drain regions 42a of the low withstand voltage n-channel transistor 42 are further provided with n-type contact regions 42d for reducing contact resistance with first plugs 23 (see FIG. 3).

The high withstand voltage transistor 43 includes n-type source/drain regions 43a having n-type low-concentration impurity regions 43b containing P (phosphorus) and n-type high-concentration impurity regions 43 containing As. The n-type low-concentration impurity regions 43b are examples of the "sixth impurity regions" in the present invention. The n-type low-concentration impurity regions 43b are formed to enclose the n-type high-concentration impurity regions 43c. Thus, the n-type low-concentration impurity regions 43b are interposed between the n-type high-concentration impurity regions 43b and a p-type silicon substrate 13, thereby relaxing field concentration over the boundary between the n-type high-concentration impurity regions 43b and the p-type silicon substrate 13. The n-type source/drain regions 43a of the high withstand voltage transistor 43 are provided with n-type contact regions 43d for reducing contact resistance with first plugs (see FIG. 3).

The low withstand voltage p-channel transistor 44 includes p-type source/drain regions 44a containing B (boron). The p-type source/drain regions 44a are provided with p-type contact regions 44c for reducing contact resistance with first plugs (see FIG. 3). The p-type contact regions 44c are examples of the "contact region" in the present invention. The low withstand voltage p-channel transistor 44 is formed in an n well 44d formed on the p-type silicon substrate 13.

According to the modification of the first embodiment, the n-type low-concentration impurity regions 43b of the high withstand voltage transistor 43 have the same impurity concentration as that of n-type impurity regions 14b of the selection transistor 41. Further, the n-type high-concentration impurity regions 43c of the high withstand voltage transistor 43 have the same impurity concentration as that of the n-type high-concentration impurity regions 42c of the low withstand voltage n-channel transistor 42. In addition, the n-type low-concentration impurity regions 42b of the low withstand voltage n-channel transistor 42 have the same impurity concentration as that of n-type low-concentration impurity regions 14a of the selection transistor 41.

A first interlayer dielectric film 21 is formed on the regions formed with the selection transistor 41, the low withstand voltage n-channel transistor 42, the high withstand voltage transistor 43 and the low withstand voltage p-channel transistor 44. Contact holes 22, 42e, 43e and 44e are provided in regions of the first interlayer dielectric film 21 corresponding to the p-type impurity regions 15 and the n-type contact regions 41c of the selection transistor 41, the n-type contact regions 42d of the low withstand voltage n-channel transistor 42, the n-type contact regions 43d of the high withstand voltage transistor 43 and the p-type contact regions 44c of the low withstand voltage p-channel transistor 44 respectively. The plugs 23 are embedded in the contact holes 22, 42e, 43e and 44e respectively.

A fabrication process for the mask ROM according to the modification of the first embodiment is now described with reference to FIGS. 14 to 21.

Figure 15:
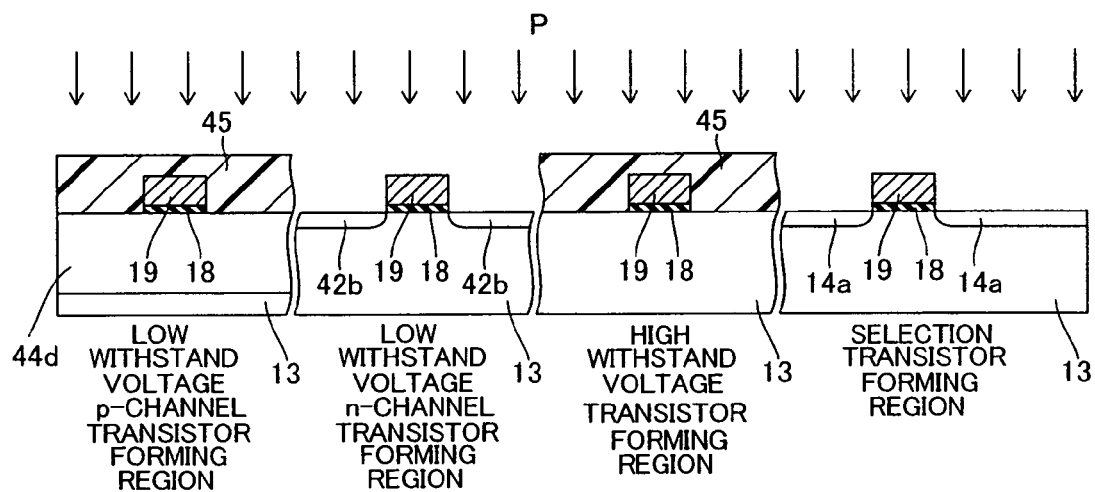
FIGS. 15 to 21 are sectional views for illustrating a fabrication process for the mask ROM according to the modification of the first embodiment of the present invention.

As shown in FIG. 15, the n well 44d is formed on the region of the p-type silicon substrate 13 for forming the low withstand voltage p-channel transistor 44. Gate electrodes 19 are formed on the p-type silicon substrate 13 through gate insulator films 18. Resist films 45 are formed to cover the regions for forming the high withstand voltage transistor 43 and the low withstand voltage p-channel transistor 44, and P (phosphorus) is thereafter ion-implanted under conditions of implantation energy of about 50 keV and a dose (quantity of implantation) of about $3.0 \times 10^{13}$ cm$^{-2}$ through the resist films 45 serving as masks. Thus, the n-type low-concentration impurity regions 42b of the low withstand voltage n-channel transistor 42 and the low-concentration impurity regions 14a of the selection transistor 41 are formed at the same time.

Figure 16:
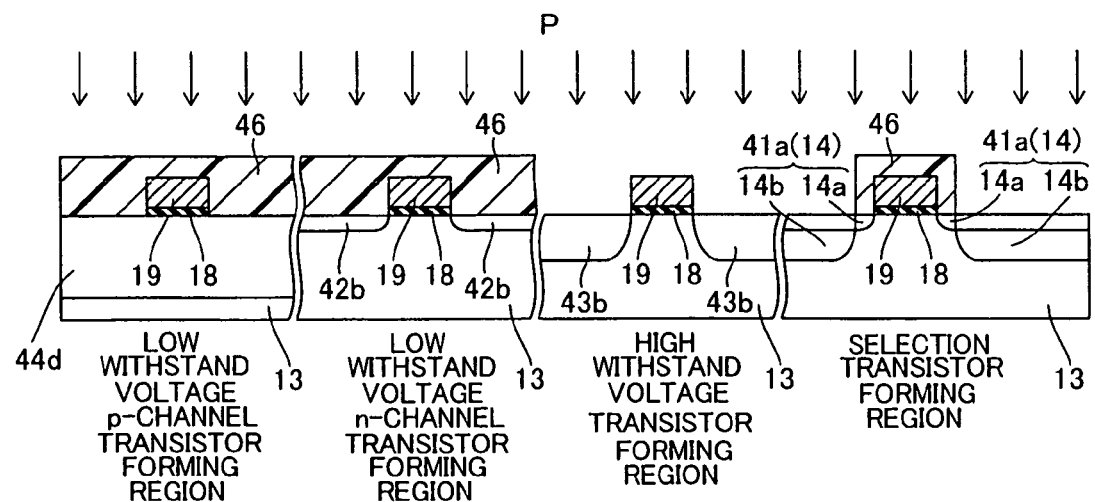

As shown in FIG. 16, resist films 46 are formed to cover the regions for forming the low withstand voltage n-channel transistor 42 and the low withstand voltage p-channel transistor 44 as well as a region of the selection transistor 41 slightly larger than the width of the corresponding gate electrode 19, and P (phosphorus) is thereafter ion-implanted under conditions of implantation energy of about 100 keV and a dose of about $3.5 \times 10^{13}$ cm$^{-2}$ through the resist films 46 serving as masks. Thus, the n-type low-concentration impurity regions 43b of the high withstand voltage transistor 43 are formed. The n-type low-concentration impurity regions 43b are formed up to regions deeper than the n-type low-concentration impurity regions 42b of the low withstand voltage n-channel transistor 42 and the low-concentration impurity regions 14a of the selection transistor 41. Further, the impurity regions 14b having the impurity concentration slightly higher than that of the low-concentration impurity regions 14a are formed on the region for forming the selection transistor 41. Thus, the n-type source/drain regions 41a consisting of the impurity regions 14a and 14b are formed on the region for forming the selection transistor 41.

Figure 17:
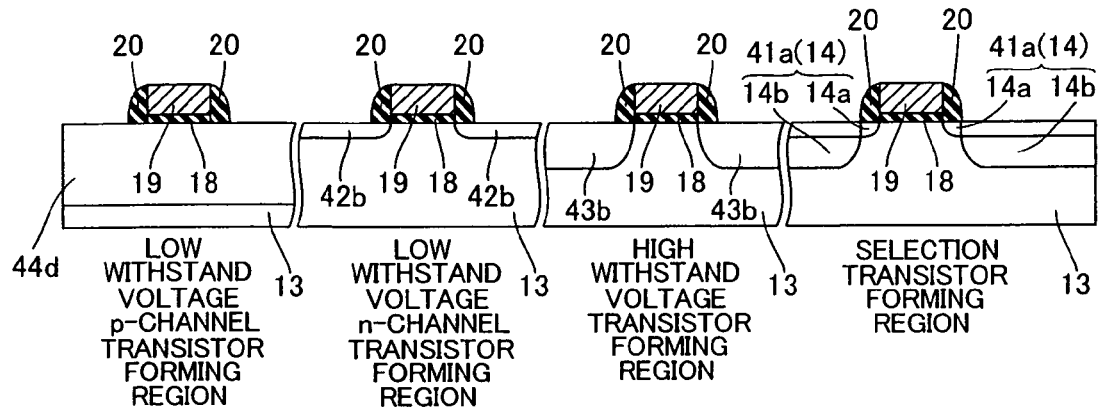

As shown in FIG. 17, an insulating film is formed to cover the overall surface and thereafter anisotropically etched thereby forming side wall spacers 20 of insulating films on the side surfaces of the gate electrodes 19.

Figure 18:
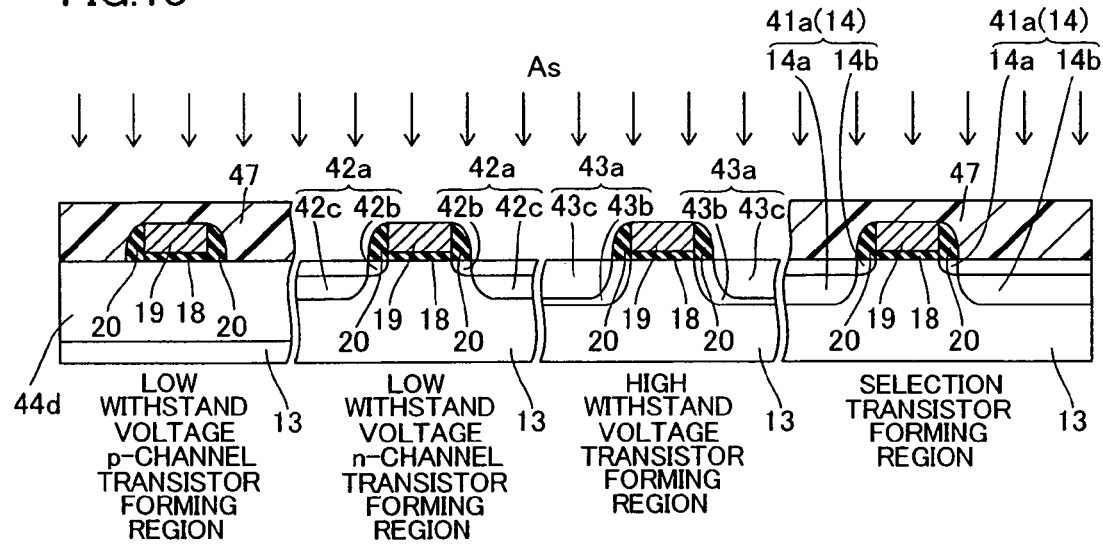

As shown in FIG. 18, resist films 47 are formed to cover the regions for forming the selection transistor 41 and the low withstand voltage p-channel transistor 44, and As is thereafter ion-implanted under conditions of implantation energy of about 70 keV and a dose of about $5.0 \times 10^{15}$ cm$^{-2}$ through the resist films 47 serving as masks. Thus, the n-type high-concentration impurity regions 42c of the low withstand voltage n-channel transistor 42 and the n-type high-concentration impurity regions 43c of the high withstand voltage transistor 43 are formed at the same time. The n-type source/drain regions 42a consisting of the n-type low-concentration impurity regions 42b and the n-type high-concentration impurity regions 42c are formed on the region for forming the low withstand voltage n-channel transistor 42, while the n-type source/drain regions 43a consisting of the n-type low-concentration impurity regions 43b and the n-type high-concentration impurity regions 43c are formed on the region for forming the high withstand voltage transistor 43.

Figure 19:
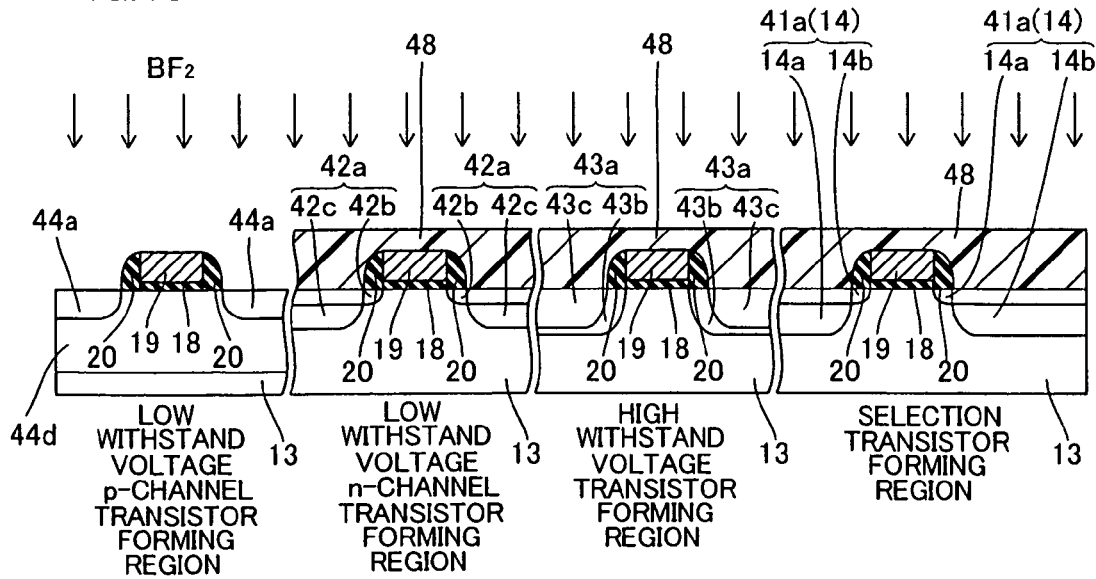

As shown in FIG. 19, resist films 48 are formed to cover the regions for forming the selection transistor 41, the low withstand voltage n-channel transistor 42 and the high withstand voltage transistor 43, and BF$_2$ is thereafter ion-implanted under conditions of implantation energy of about 50 keV and a dose of about $2.0 \times 10^{15}$ cm$^{-2}$ through the resist films 48 serving as masks. Thus, the p-type source/drain regions 44a of the low withstand voltage p-channel transistor 44 are formed.

Figure 20:
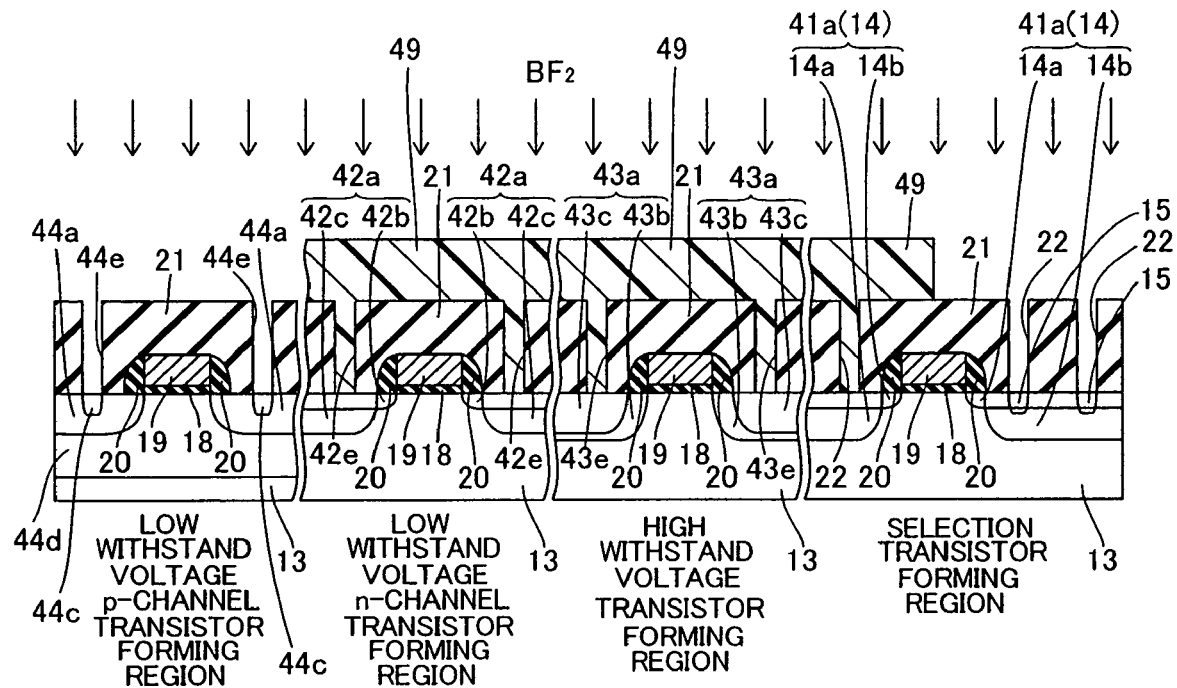

As shown in FIG. 20, heat treatment is so performed as to thermally diffusing the p-type impurity in the p-type source/drain regions 44a of the low withstand voltage p-channel transistor 44. Thus, the p-type source/drain regions 44a are formed up to portions located under the side wall spacers 20 of the low withstand voltage p-channel transistor 44. The first interlayer dielectric film 21 is formed through a process similar to that in the aforementioned first embodiment, to cover the regions for forming the selection transistor 41, the low withstand voltage n-channel transistor 42, the high withstand voltage transistor 43 and the low withstand voltage p-channel transistor 44 respectively. Then, the contact holes 22, 42e, 43e and 44e are formed in the regions of the first interlayer dielectric film 21 corresponding to the n-type source/drain regions 41a of the selection transistor 41, the n-type source/drain regions 42a of the low withstand voltage n-channel transistor 42, the n-type source/drain regions 43a of the high withstand voltage transistor 43 and the p-type source/drain regions 44a of the low withstand voltage p-channel transistor 44 respectively. Resist films 49 are formed to cover regions of the first interlayer dielectric film 21 corresponding to the source regions of the selection transistor 41, the region for forming the low withstand voltage n-channel transistor 42 and the region for forming the high withstand voltage transistor 43. Thereafter BF$_2$ is ion-implanted under conditions of implantation energy of about 40 keV and a dose of about $2.0 \times 10^{15}$ cm$^{-2}$ through the resist films 49 serving as masks. Thus, the p-type contact regions 44c of the low withstand voltage p-channel transistor 44 and the p-type impurity regions 15 are formed at the same time. The p-type impurity regions 15 and the n-type impurity regions 14 form the diodes.

Figure 21:
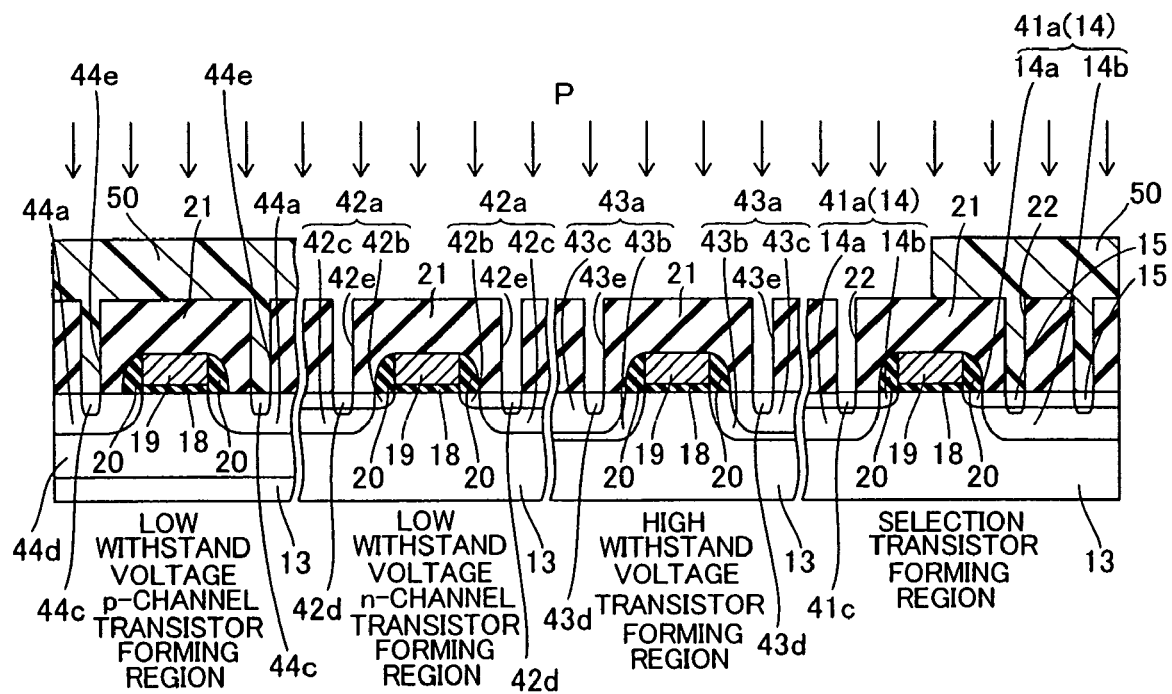

As shown in FIG. 21, resist films 50 are finally formed to cover regions of the first interlayer dielectric film 21 corresponding to the drain regions of the selection transistor 41 and the region for forming the low withstand voltage p-channel transistor 44, and P (phosphorus) is thereafter ion-implanted under conditions of implantation energy of about 25 keV and a dose of about $3.0 \times 10^{14}$ cm$^{-2}$ through the resist films 50 serving as masks. Thus, the n-type contact regions 41c, 42d and 43d are formed in the source regions of the selection transistor 41, the source/drain regions 42a of the low withstand voltage n-channel transistor 42 and the source/drain regions 43a of the high withstand voltage transistor 43 respectively. Thereafter the plugs 23 are embedded in the contact holes 22, 42e, 43e and 44e respectively. Thus, the selection transistor 41, the low withstand voltage n-channel transistor 42, the high withstand voltage transistor 43 and the low withstand voltage p-channel transistor 44 are formed as shown in FIG. 14.

The remaining fabrication process according to the modification of the first embodiment is similar to that of the aforementioned first embodiment.

Figure 22:
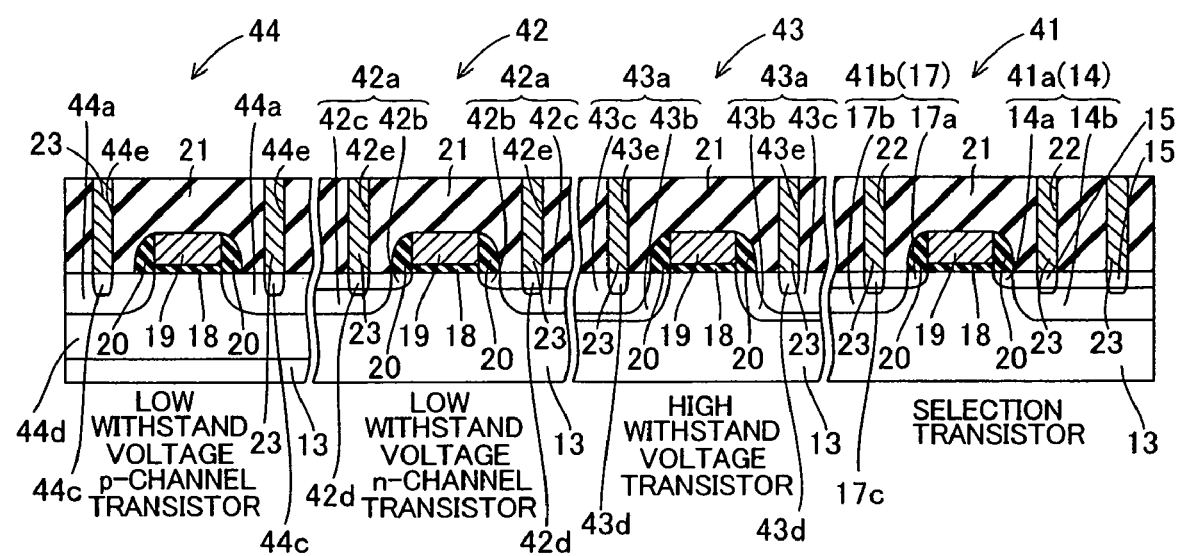
FIG. 22 is a sectional view for illustrating the structure of a mask ROM according to another modification of the first embodiment of the present invention.

According to the modification of the first embodiment, as hereinabove described, the n-type low-concentration impurity regions 43b of the high withstand voltage transistor 43 are formed to have the same impurity concentration as that of the n-type impurity regions 14b of the selection transistor 41, the n-type high-concentration impurity regions 43c of the high withstand voltage transistor 43 are formed to have the same impurity concentration as that of the n-type high-concentration impurity regions 42c of the low withstand voltage n-channel transistor 42 and the n-type low-concentration impurity regions 42b of the low withstand voltage n-channel transistor 42 are formed to have the same impurity concentration as that of the n-type impurity regions 14a of the selection transistor 41, so that the n-type low-concentration impurity regions 43b of the high withstand voltage transistor 43 can be formed through the same step as that for the impurity regions 14b of the selection transistor 41 and the n-type high-concentration impurity regions 43c of the high withstand voltage transistor 43 can be formed through the same step as that for the n-type high-concentration impurity regions 42c of the low withstand voltage n-channel transistor 42. Further, the n-type low-concentration impurity regions 42b of the low withstand voltage n-channel transistor 42 can be formed through the same step as that for the impurity regions 14a of the selection transistor 41. In addition, the p-type impurity regions 15 constituting the diodes can be formed through the same step as that for the p-type contact regions 44c of the low withstand voltage p-channel transistor 44. Thus, a fabrication process for forming the selection transistor 41 and the diodes on a memory cell array can be partially rendered common to that for the low withstand voltage n-channel transistor 42, the high withstand voltage transistor 43 and the low withstand voltage p-channel transistor 44 of the peripheral circuit, whereby the fabrication process is not much complicated despite provision of the selection transistor 41 and the diode. According to another modification of the first embodiment, a source region 41 (17) of a selection transistor 41 can be constituted similarly to n-type source/drain regions 42a of a low withstand voltage n-channel transistor 42, as shown in FIG. 22.

Second Embodiment

The structure of an MRAM (magnetic random access memory) according to a second embodiment of the present invention is now described with reference to FIGS. 23 to 28. The second embodiment is described with reference to an example of forming a drain region 66 of each selection transistor 61 and a cathode of a diode 50 included in each memory cell 59 by a common impurity region in a crosspoint MRAM.

Figure 23:
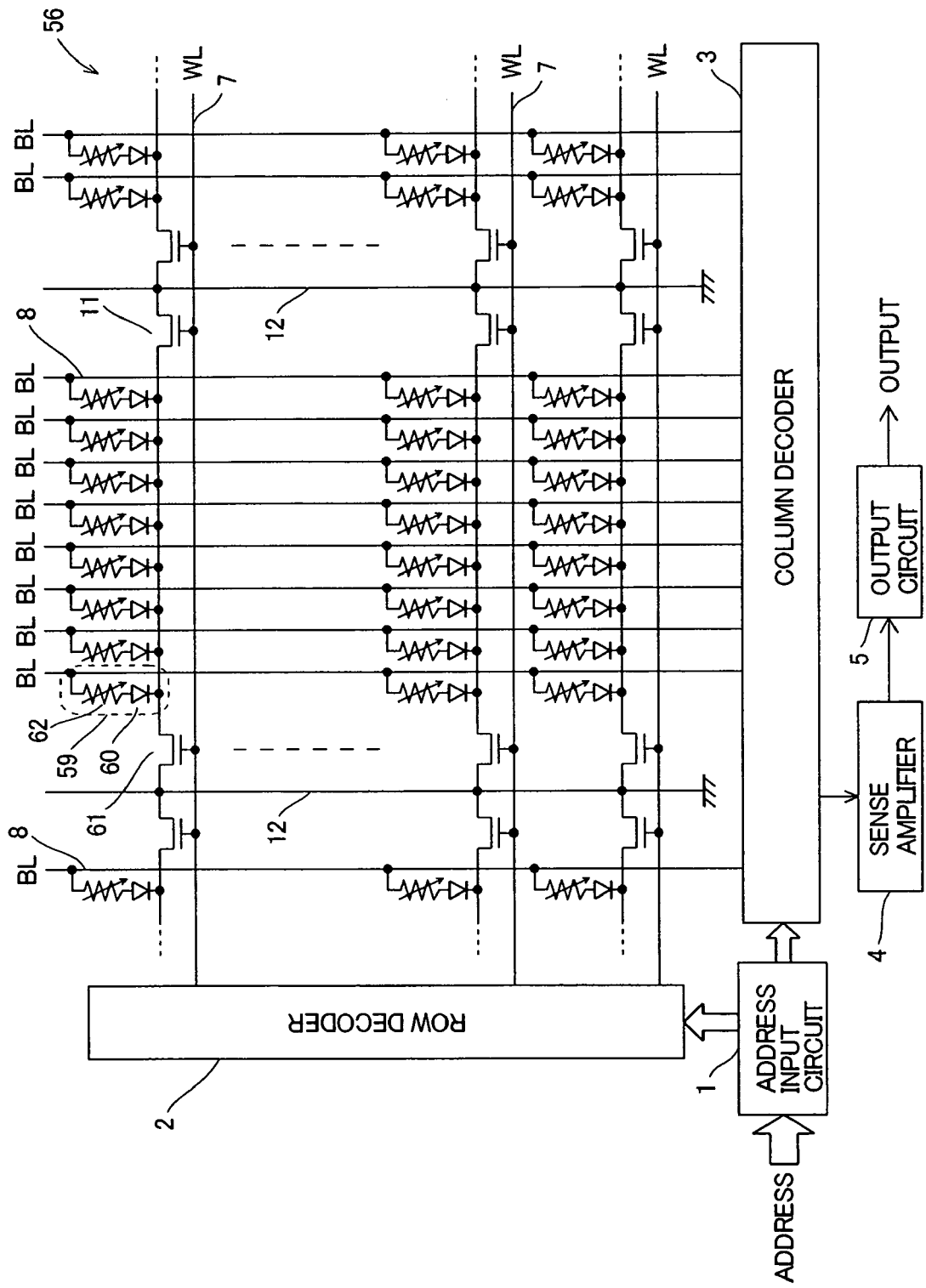
FIG. 23 is a circuit diagram showing the structure of an MRAM according to a second embodiment of the present invention.

In the MRAM according to the second embodiment, each memory cell 59 arranged on a memory cell array 56 comprises a single diode 60 and a single TMR (tunneling magnetoresistance) element 62, as shown in FIG. 23. The TMR element 62 is an example of the "element with resistance change" in the present invention. The TMR element 62 has a first electrode connected to the anode of the diode 50 and a second electrode connected to a corresponding bit line (BL) 8. The remaining circuit structure of the MRAM according to the second embodiment is similar to that of the mask ROM according to the aforementioned first embodiment.

Figure 24:
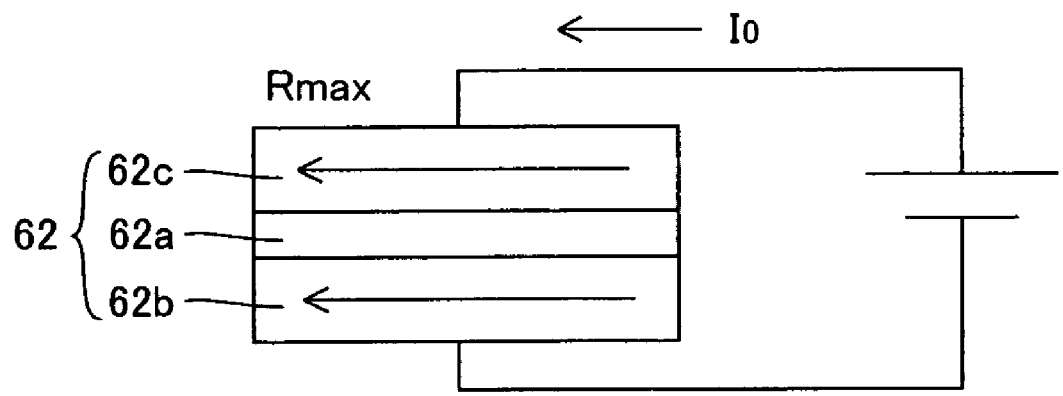
FIGS. 24 and 25 are model diagrams for illustrating the structure of a TMR element employed for the MRAM according to the second embodiment shown in FIG. 23.
Figure 25:
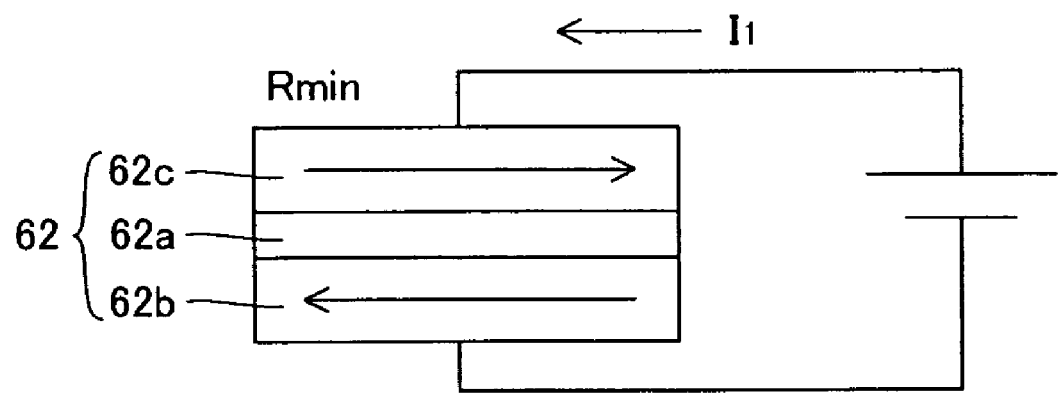

As shown in FIGS. 24 and 25, the TMR element 62 is formed by holding a nonmagnetic layer 62a consisting of a thin oxide film (alumina) by a pin layer 62b and a free layer 62c of magnetic substances. The pin layer 62b is constituted of a magnetic layer having a hardly changing magnetic direction. The free layer 62c is constituted of a magnetic layer having an easily changing magnetic direction. The TMR element 62 is so formed that the quantity of current flowing therethrough varies with the magnetic directions of the pin layer 62b and the free layer 62c. In other words, resistance of the TMR element 62 is reduced to increase the quantity of current $I_0$ (see FIG. 24) flowing through the TMR element 62 when the magnetic directions of the pin layer 62b and the free layer 62c are identical to each other. When the magnetic directions of the pin layer 62b and the free layer 62c are different from each other, on the other hand, the resistance of the TMR element 62 is increased to reduce the quantity of current $I_1$ (see FIG. 25) flowing through the TMR element 62.

Figure 26:
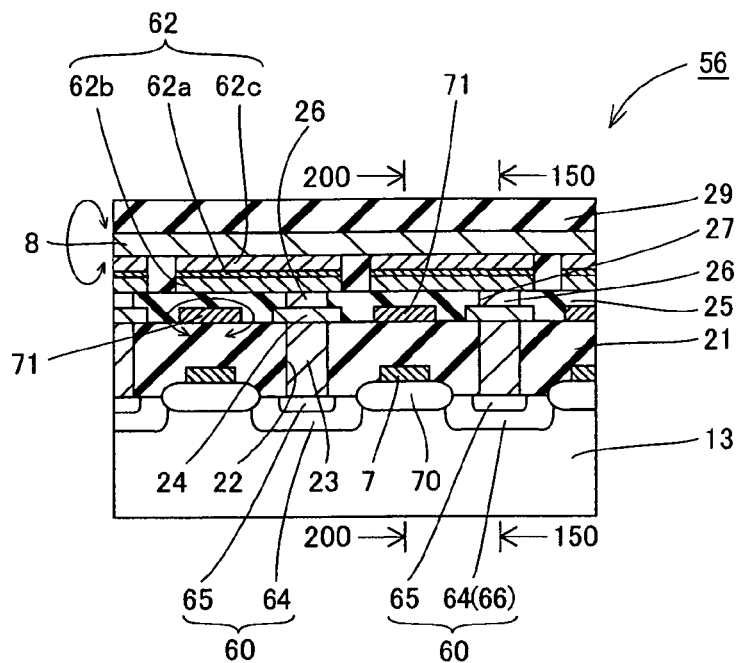
FIG. 26 is a sectional view showing the structure of a memory cell array of the MRAM according to the second embodiment shown in FIG. 23.
Figure 27:
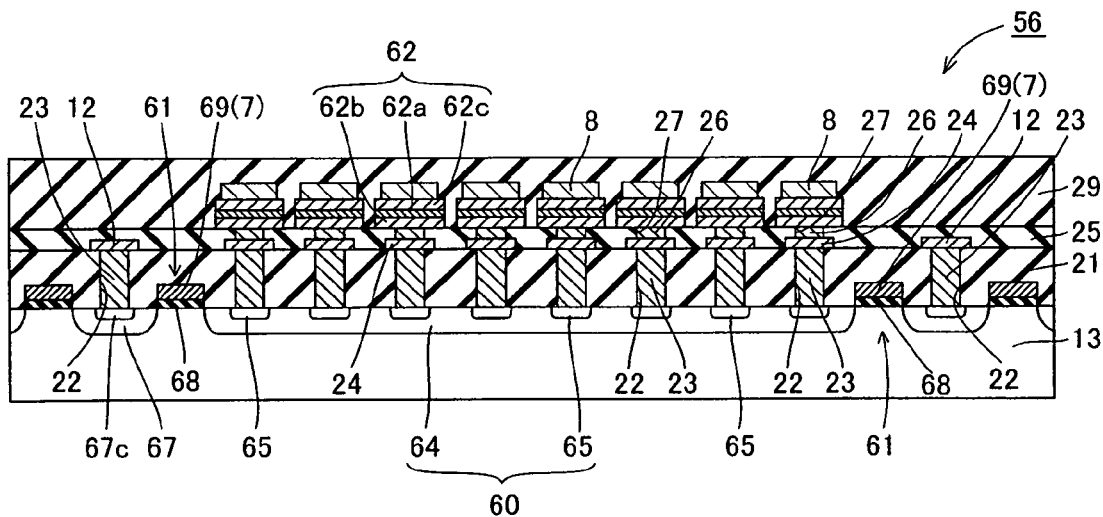
FIG. 27 is a sectional view of the memory cell array of the MRAM according to the second embodiment taken along the line 150-150 in FIG. 26.

In the memory cell array 56 of the MRAM according to the second embodiment, a plurality of n-type impurity regions 64 containing P (phosphorus) are formed on the upper surface of a p-type silicon substrate 13 at prescribed intervals, as shown in FIGS. 26 and 27. The n-type impurity regions 64 are examples of the "first impurity region" in the present invention. Further, p-type impurity regions 65 containing B (boron) are formed in the n-type impurity regions 64. The p-type impurity regions 65 are examples of the "second impurity regions" in the present invention. The p-type impurity regions 65 and the n-type impurity regions 64 constitute the diodes 60. Selection transistors 61 are provided on both sides of the n-type impurity regions 64 along the longitudinal direction of the n-type impurity regions 64, as shown in FIG. 27.

According to the second embodiment, each n-type impurity region 64 is employed in common as the cathodes of a plurality of (eight) diodes 60 and drain regions 66 of the corresponding selection transistors 61. N-type source regions 67 of the selection transistors 61 are provided on the upper surface of the p-type silicon substrate 13 at prescribed intervals from the n-type impurity region 64. Further, n-type contact regions 67c are formed in the n-type source regions 67 for reducing contact resistance following connection of first plugs 23 to the n-type source regions 67. Gate electrodes 69 of polysilicon are provided on channel regions between the n-type impurity region 64 and the source regions 67 through gate insulating films 68.

As shown in FIG. 26, an element separation insulating film 70 of silicon oxide is formed between each pair of n-type impurity regions 64 adjacent to each other along the longitudinal direction of the bit lines BL. Word lines 7 of polysilicon are provided on such element separation insulating films 70. The aforementioned gate electrodes 69 are formed integrally with the corresponding word lines 7. Lining wires 71 of Al for the word lines 7 are provided on a first interlayer dielectric film 21 provided on the upper surface of the p-type silicon substrate 13 to cover the word lines 7 in correspondence to the word lines 7, as shown in FIGS. 26 and 27. The lining wires 71 are connected to the corresponding word lines 7 through plugs (not shown) on prescribed regions.

The TMR element 62 having the aforementioned structure is provided on a second interlayer dielectric film 25 formed on the first interlayer dielectric film 21. The pin layer 62b of the TMR element 62 is connected to the corresponding p-type impurity region 65 (anode of the diode 60) through the corresponding first plug 23, a connection layer 24 and a second plug 26. A bit line 8 of Al is formed on the free layer 62c of the TMR element 62. This bit line 8 is formed to extend perpendicularly to the longitudinal direction of the lining wires 61 for the word lines 7.

The remaining structure of the MRAM according to the second embodiment is similar to that of the mask ROM according to the aforementioned first embodiment.

Operations of the MRAM according to the second embodiment are now described with reference to FIG. 26.

In order to rewrite data in the MRAM according to the second embodiment, currents perpendicular to each other are fed to a prescribed bit line 8 and the lining wire 71 for the corresponding word line 7. Thus, data of only the TMR element 62 located on the intersection between the bit line 8 and the lining wire 71 can be rewritten. More specifically, the currents flowing to the lining wire 71 and the bit line 8 generate magnetic fields so that the sum (composite magnetic field) of the two magnetic fields acts on the TMR element 62. The magnetic direction of the free layer 62c of the TMR element 62 is inverted due to the composite magnetic field. Thus, the data held in the TMR element 62 is rewritten from "1" to "0", for example. In order to read data from the MRAM according to the second embodiment, a sense amplifier 4 determines data "0" or "1" on the basis of change of a current flowing due to resistance change of the TMR element 62. The remaining read operation is similar to that of the mask ROM according to the aforementioned first embodiment.

According to the second embodiment, as hereinabove described, the memory cell size can be reduced in the MRAM having the TMR elements 62 provided on the diodes 10, while the structure of and a fabrication process for a memory cell array region can be simplified.

The remaining effects of the second embodiment are similar to those of the aforementioned first embodiment.

Figure 29:
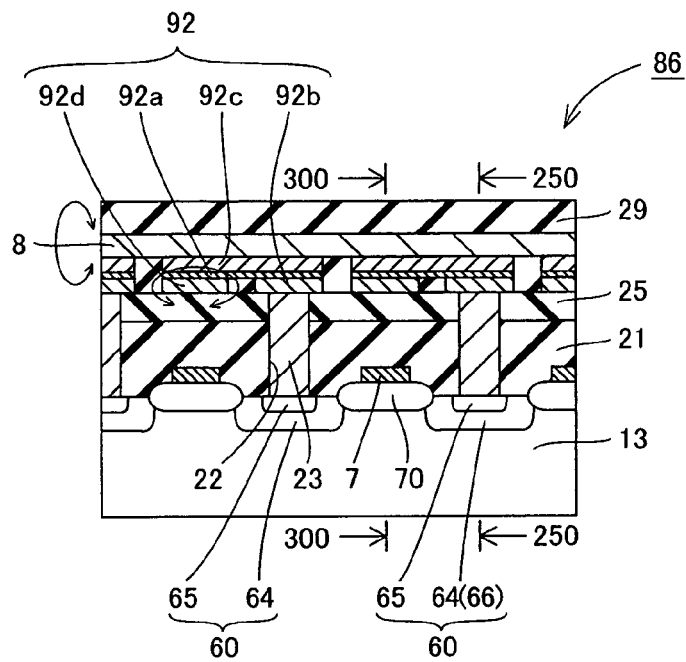
FIG. 29 is a sectional view showing the structure of a memory cell array of an MRAM according to a modification of the second embodiment.
Figure 30:
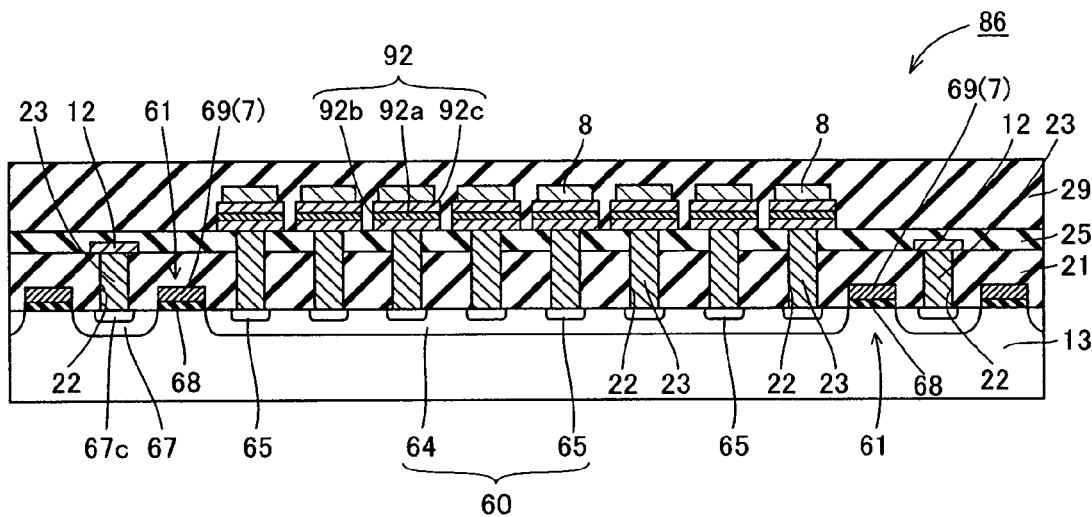
FIG. 30 is a sectional view of the memory cell array of the MRAM according to the modification of the second embodiment taken along the line 250-250 in FIG. 29.
Figure 31:
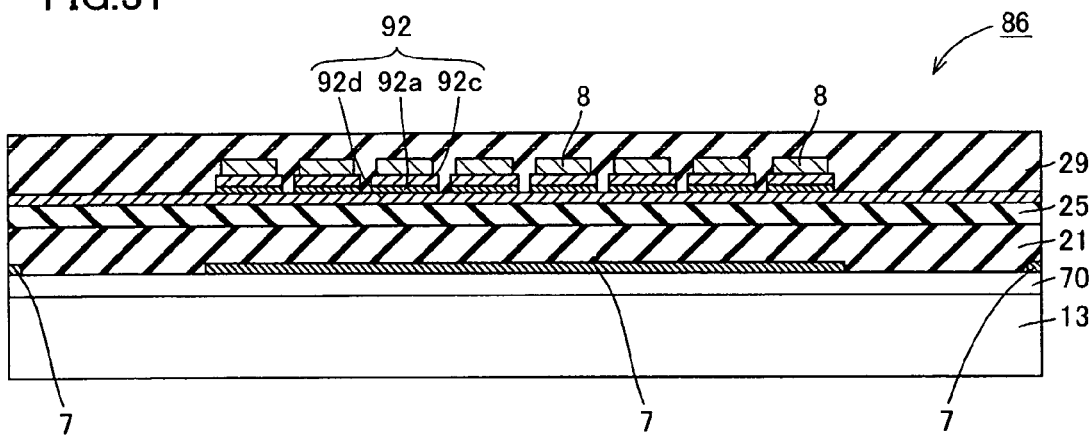
FIG. 31 is another sectional view of the memory cell array of the MRAM according to the modification of the second embodiment taken along the line 300-300 in FIG. 29.
Figure 32:
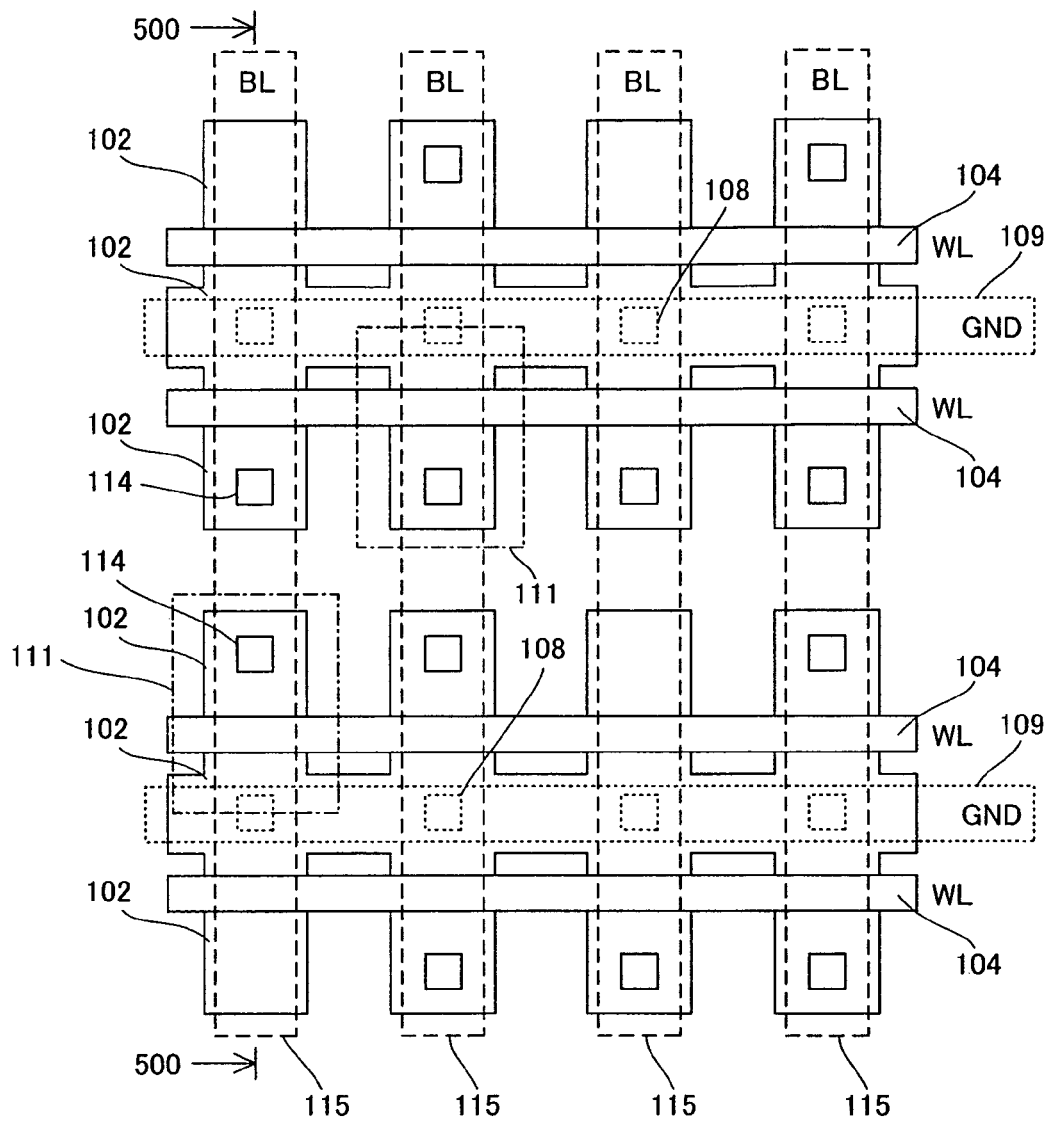
FIG. 32 is a plane layout diagram showing the structure of an exemplary conventional mask ROM.
Figure 33:
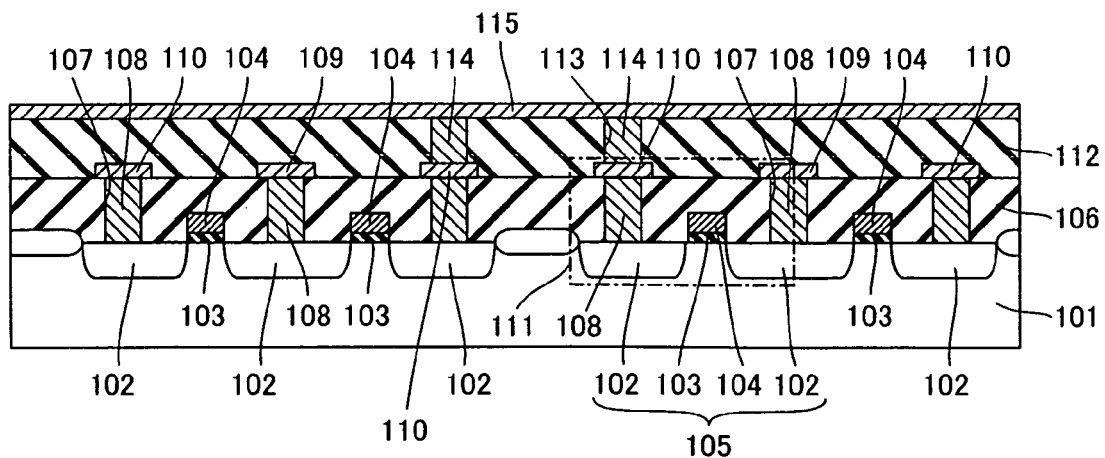
FIG. 33 is a sectional view of the exemplary conventional mask ROM taken along the line 500-500 in FIG. 32.

The structure of an MRAM according to a modification of the second embodiment is now described with reference to FIGS. 29 to 31.

The MRAM according to the modification of the second embodiment is so constituted as to rewrite data of a prescribed TMR element 92 by directly feeding a current to a pin layer 92d of the TMR element 92, dissimilarly to the MRAM according to the aforementioned second embodiment. More specifically, each TMR element 92 has a pin layer 92b and the pin layer 92d divided from each other. The pin layer 92b is connected to a corresponding p-type impurity region 65 (anode of a diode 60) through a plug 23, as shown in FIGS. 29 and 30. The other pin layer 92d is formed to extend perpendicularly to the longitudinal direction of bit lines 8, as shown in FIG. 31. The pin layer 92d is connected to a plug (not shown) connected to a corresponding word line 7 on a prescribed region. According to the modification of the second embodiment, no lining wire 71 (see FIG. 26) is provided for the word line 7. The remaining structure of the MRAM according to the modification of the second embodiment is similar to that of the MRAM according to the aforementioned second embodiment.

Operations of the MRAM according to the modification of the second embodiment are now described. In order to rewrite data, the MRAM according to the modification of the second embodiment feeds currents perpendicular to each other to a prescribed bit line 8 and the pin layer 92d of the corresponding TMR element 92. Thus, the currents flowing to the bit line 8 and the pin layer 92d generate magnetic fields so that the composite magnetic field of the two magnetic fields inverts the magnetic direction of a free layer 92c. Thus, the data held in the TMR element 92 is rewritten from "1" to "0", for example. The remaining operations of the MRAM according to the modification of the second embodiment are similar to those of the MRAM according to the aforementioned second embodiment.

According to the modification of the second embodiment, as hereinabove described, the MRAM feeds the current to the pin layer 92d of the prescribed TMR element 92 for rewriting data, so that the pin layer 92d close to the free layer 92c can generate a magnetic field. Also when feeding a small current to the pin layer 92d, the MRAM can sufficiently invert the magnetic direction of the free layer 92, for efficiently rewriting the data of the TMR element 92 with the small current.

Although the present invention has been described and illustrated in detail, it is clearly understood that the same is by way of illustration and example only and is not to be taken by way of limitation, the spirit and scope of the present invention being limited only by the terms of the appended claims.

For example, while the present invention is applied to a crosspoint mask ROM or an MRAM in each of the aforementioned embodiments, the present invention is not restricted to this but is widely applicable to a crosspoint memory or a non-crosspoint memory other than the mask ROM or the MRAM. More specifically, while the second embodiment has been described with reference to the MRAM employing the TMR elements as elements with resistance change, the present invention is not restricted to this but may alternatively be applied to a memory employing elements other than TMR elements as those with resistance change. For example, the present invention may be applied to an OUM (ovonic unified memory) employing elements thermally switched between amorphous and crystalline states accompanying change of resistance values or an RRAM (resistance random access memory) employing CMR (colossal magnetoresistive) elements having resistance values remarkably changed upon application of a voltage pulse.

While each n-type impurity region 14 constituting the cathode of the diode 10 is constituted of the low-concentration impurity region 14a and the impurity region 14b having the impurity concentration slightly higher than that of the impurity region 14a in the aforementioned first embodiment, the present invention is not restricted to this but the impurity regions 14a and 14b of the n-type impurity region 14 may alternatively have substantially identical impurity concentrations. Further, the n-type impurity region 14 may alternatively be composed of only the impurity region 14a. In this case, ion implantation conditions are preferably set to form the corresponding p-type impurity regions 15 in the impurity region 14a. Further, each memory can alternatively be formed while exchanging the conductive types of the p- and n-type regions in each of the aforementioned embodiments and the modifications thereof.

What is claimed is:

1. A method of fabricating a memory, comprising steps of:
    forming a first conductive type first impurity region functioning as a first electrode of a diode included in a memory cell by introducing a first conductive type impurity into a memory cell array region on the main surface of a semiconductor substrate, wherein said step of forming said first impurity region includes steps of forming a low-concentration impurity region and forming a high-concentration impurity region so as to reach a deeper region than said low-concentration impurity region; and
    forming a plurality of second conductive type second impurity regions each functioning as a second electrode of said diode with respect to one said first conductive type first impurity region by introducing a second conductive type impurity into prescribed regions of the surface of said first impurity region.

2. The method of fabricating a memory according to claim 1, further comprising steps of:
    forming an interlayer dielectric film having openings on said first impurity region, and
    forming wires connected to said second impurity regions through said openings, wherein
    said step of forming said second impurity regions includes a step of ion-implanting said second conductive type impurity into said first impurity region through said openings.

3. The method of fabricating a memory according to claim 2, further comprising steps of:
    forming a source/drain region of a transistor included in a peripheral circuit by introducing said second conductive type impurity into said peripheral circuit region on the main surface of said semiconductor substrate, and
    forming a contact region for reducing contact resistance following connection of a wire to said source/drain region by ion-implanting said second conductive type impurity into a prescribed region of the surface of said source/drain region, wherein
    said step of forming said contact region is carried out simultaneously with said step of ion-implanting said second conductive type impurity into said first impurity region.

4. A method of fabricating a memory, comprising steps of:
    forming a first conductive type first impurity region functioning as a first electrode of a diode included in a memory cell by introducing a first conductive type impurity into a memory cell array region on the main surface of a semiconductor substrate, wherein said step of forming said first impurity region includes steps of forming a low-concentration impurity region and forming a high-concentration impurity region so as to reach a deeper region than said low-concentration impurity region;

forming an interlayer dielectric film having openings on said first impurity region;

forming a plurality of second conductive type second impurity regions each functioning as a second electrode of said diode by introducing a second conductive type impurity into prescribed regions of the surface of said first impurity region;

forming wires connected to said second impurity regions through said openings, wherein said step of forming said second impurity regions includes a step of ion-implanting said second conductive type impurity into said first impurity region through said openings;

forming a source/drain region of a transistor included in a peripheral circuit by introducing said second conductive type impurity into said peripheral circuit region on the main surface of said semiconductor substrate; and forming a contact region for reducing contact resistance following connection of a wire to said source/drain region by ion-implanting said second conductive type impurity into a prescribed region of the surface of said source/drain region, wherein said step of forming said contact region is carried out simultaneously with said step of ion-implanting said second conductive type impurity into said first impurity region.

* * * * *